United States Patent
Kaneko et al.

(10) Patent No.: US 9,633,821 B2
(45) Date of Patent: *Apr. 25, 2017

(54) MICROWAVE PLASMA PROCESSING APPARATUS AND MICROWAVE SUPPLYING METHOD

(71) Applicant: TOKYO ELECTRON LIMITED, Tokyo (JP)

(72) Inventors: Kazushi Kaneko, Miyagi (JP); Toshihiko Iwao, Miyagi (JP); Satoru Kawakami, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/051,816

(22) Filed: Feb. 24, 2016

(65) Prior Publication Data

US 2016/0172163 A1    Jun. 16, 2016

Related U.S. Application Data

(63) Continuation of application No. 14/326,649, filed on Jul. 9, 2014, now Pat. No. 9,305,751.

(30) Foreign Application Priority Data

Jul. 10, 2013   (JP) .................................. 2013-145045

(51) Int. Cl.
*H01J 37/32*  (2006.01)
*H01J 37/244*  (2006.01)

(52) U.S. Cl.
CPC ....... *H01J 37/32311* (2013.01); *H01J 37/244* (2013.01); *H01J 37/3222* (2013.01);
(Continued)

(58) Field of Classification Search
CPC ............... H01J 37/244; H01J 37/32201; H01J 37/3222; H01J 37/32229; H01J 37/32238; H01J 37/32266; H01J 37/32311
See application file for complete search history.

(56) References Cited

U.S. PATENT DOCUMENTS

| 5,389,154 A * | 2/1995 | Hiroshi ............. H01J 37/32192 118/723 ME |
| 2005/0173069 A1* | 8/2005 | Tolmachev ....... H01J 37/32247 156/345.36 |

(Continued)

FOREIGN PATENT DOCUMENTS

| JP | 3-191074 A | 8/1991 |
| JP | 9-063793 A | 3/1997 |
| JP | 2007-213994 A | 8/2007 |

*Primary Examiner* — Alexander H Taningco
*Assistant Examiner* — Kurtis R Bahr
(74) *Attorney, Agent, or Firm* — Rothwell, Figg, Ernst & Manbeck, P.C.

(57) ABSTRACT

Disclosed is a microwave plasma processing apparatus including: a processing container configured to define a processing space; a microwave generator configured to generate microwaves; a distributor configured to distribute the microwaves to a plurality of waveguides; an antenna installed in the processing container and to radiate the microwaves distributed to the plurality of waveguides to the processing space; a monitor unit configured to monitor a voltage of each of the plurality of waveguides; a storage unit configured to store a difference between a monitor value of the voltage monitored by the monitor unit and a predetermined reference value of the voltage and a control value of a distribution ratio of the distributor corresponding to the difference; and a control unit configured to acquire the control value of the distribution ratio of the distributor from the storage unit and to control the distribution ratio of the distributor.

6 Claims, 13 Drawing Sheets

(52) U.S. Cl.
CPC .... *H01J 37/3299* (2013.01); *H01J 37/32192* (2013.01); *H01J 37/32201* (2013.01); *H01J 37/32211* (2013.01); *H01J 37/32229* (2013.01); *H01J 37/32238* (2013.01); *H01J 37/32266* (2013.01); *H01J 37/32935* (2013.01)

(56) References Cited

U.S. PATENT DOCUMENTS

| | | | |
|---|---|---|---|
| 2006/0021980 A1* | 2/2006 | Lee | A61L 2/14 219/747 |
| 2006/0137613 A1* | 6/2006 | Kasai | H01J 37/32192 118/723 MW |
| 2009/0047752 A1* | 2/2009 | Yamazaki | C23C 16/24 438/96 |
| 2009/0232715 A1* | 9/2009 | Suzuki | H05H 1/46 422/186.05 |
| 2010/0176121 A1* | 7/2010 | Nobue | H05B 6/686 219/716 |
| 2010/0224324 A1* | 9/2010 | Kasai | H01J 37/32192 156/345.36 |
| 2010/0239782 A1* | 9/2010 | Sasaki | C23C 16/45565 427/575 |

* cited by examiner

| Monitor Difference | Control Value |
|---|---|
| D1 | C1 |
| D2 | C2 |
| ... | ... |

MICROWAVE PLASMA PROCESSING APPARATUS AND MICROWAVE SUPPLYING METHOD

CROSS-REFERENCE TO RELATED APPLICATIONS

This application is a continuation of U.S. patent application Ser. No. 14/326,649, filed on Jul. 9, 2014, which claims priority from Japanese Patent Application No. 2013-145045, filed on Jul. 10, 2013 with the Japan Patent Office, all of which are incorporated herein in their entireties by reference.

TECHNICAL FIELD

Various aspects and exemplary embodiments disclosed herein relate to a microwave plasma processing apparatus and a microwave supplying method.

BACKGROUND

A microwave plasma processing apparatus known in the related art uses high density plasma excited by a microwave electric field. For example, the microwave plasma processing apparatus has a processing container configured to plasma-process a substrate to be processed, a microwave generator configured to generate microwaves to generate plasma of a processing gas in the processing container, and a waveguide configured to guide the microwave generated by the microwave generator into the processing container. Further, the microwave plasma processing apparatus includes a planar antenna having a plurality of slots that transmit the microwaves guided by the waveguide. In the microwave plasma processing apparatus, the microwaves are radiated into the processing container from the slot antenna and the processing gas in the processing container is deionized to excite the plasma.

However, in such a microwave plasma processing apparatus, it is requested that the plasma excited by the microwaves be uniformly distributed in processing space of the processing container in order to ensure uniform plasma processing of the entire processed surface of a workpiece. In this regard, there is a known technology in which a distributor is installed at a rear end side of the microwave generator to distribute the microwaves from the microwave generator to a plurality of waveguides by the distributor at a predetermined distribution ratio and radiate the distributed microwaves to a center side and a periphery side of the processing space from the antenna. See, for example, Japanese Patent Laid-Open Publications Nos. H9-63793, H3-191074, and 2007-213994.

SUMMARY

In an exemplary embodiment, a microwave plasma processing apparatus disclosed herein includes a processing container configured to define a processing space; a microwave generator configured to generate microwaves for generating plasma of a processing gas introduced into the processing space; a distributor configured to distribute the microwaves to a plurality of waveguides; an antenna installed in the processing container and to radiate the microwaves distributed to the plurality of waveguides by the distributor, to the processing space; a monitor unit configured to monitor a voltage of each of the plurality of waveguides; a storage unit configured to store a difference between a monitor value of the voltage monitored by the monitor unit and a predetermined reference value of the voltage and a control value of a distribution ratio of the distributor corresponding to the difference; and a control unit configured to acquire the control value of the distribution ratio of the distributor, which corresponds to the difference between the monitor value of the voltage monitored by the monitor unit and the predetermined reference value of the voltage, from the storage unit and to control the distribution ratio of the distributor based on the acquired control value thereby distributing the microwaves to the plurality of waveguides of the antenna.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

DETAILED DESCRIPTION

Figure 1:
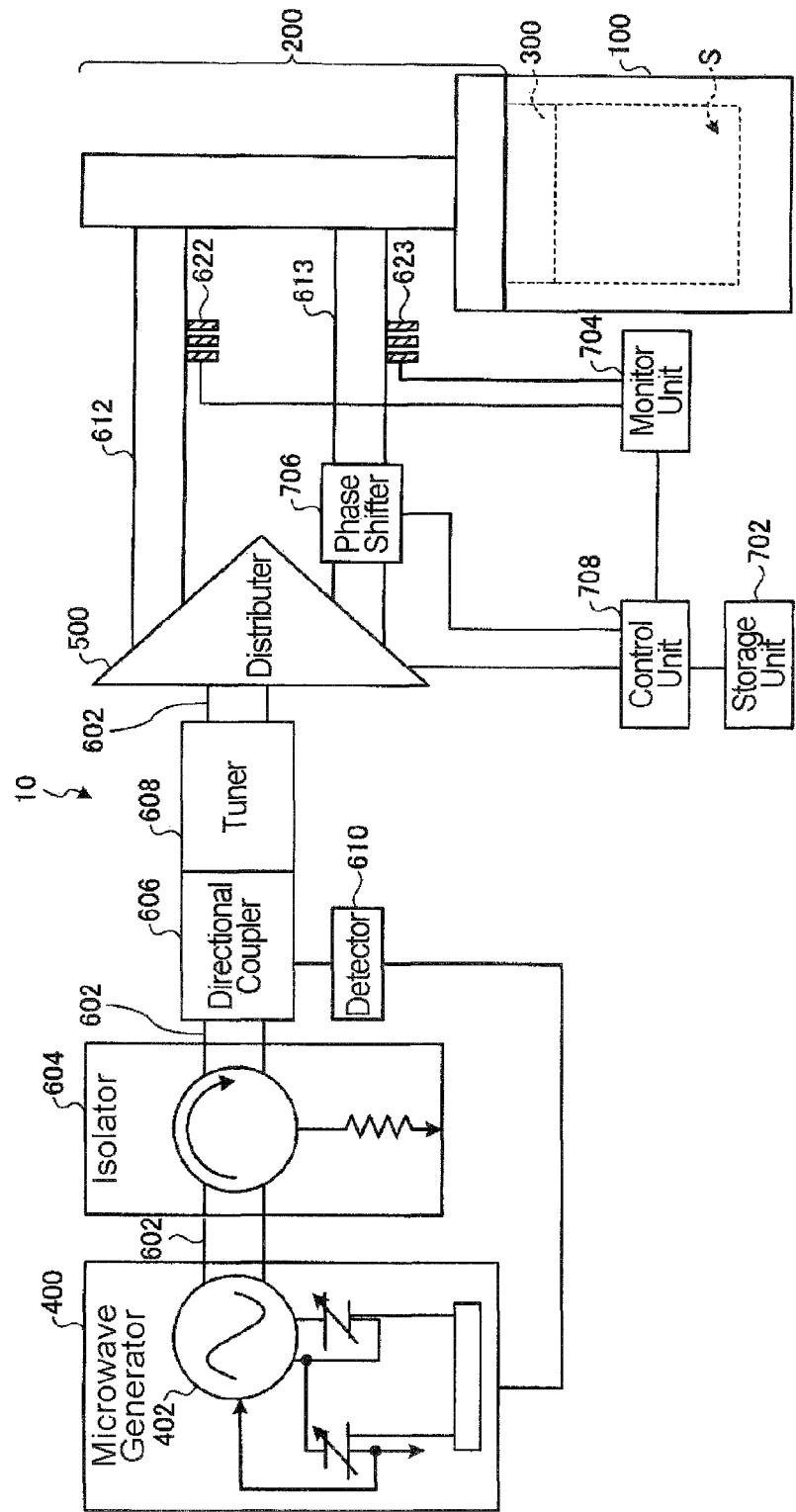
FIG. 1 is a diagram illustrating an example of an external configuration of a microwave plasma processing apparatus according to a first exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

In the aforementioned technology, the microwave distribution ratio is fixed in the distributor. Thus, the distribution uniformity of plasma excited by microwaves may be impaired in the processing space of the processing container.

According to an exemplary embodiment of the disclosed microwave plasma processing apparatus disclosed herein, the distribution uniformity of plasma excited by microwaves can be maintained.

Hereinafter, exemplary embodiments of the microwave plasma processing apparatus disclosed herein will be described in detail with reference to the accompanying drawings. Meanwhile, the present disclosure is not limited by the exemplary embodiments. The exemplary embodiments may be properly combined with each other without making processing contents thereof contradictory.

(First Exemplary Embodiment)

In an exemplary embodiment, a microwave plasma processing apparatus of a first exemplary embodiment includes: processing container configured to define a processing space; a microwave generator configured to generate microwaves for generating plasma of a processing gas introduced into the processing space; a distributor configured to distribute the microwaves to a plurality of waveguides; an antenna installed in the processing container to seal the processing space and to radiate the microwaves distributed to the plurality of waveguides by the distributor, to the processing space; a monitor unit configured to monitor a voltage of each of the plurality of waveguides; and a control unit configured to acquire a control value of a distribution ratio of the distributor, which corresponds to a difference between a monitor value of the voltage monitored by the monitor unit and a predetermined reference value of the voltage, from a storage unit that stores the difference and the control value of the distribution ratio of the distributor corresponding to the difference to correspond to each other. The control unit is also configured to control the distribution ratio of the distributor, based on the acquired control value.

In an exemplary embodiment, the microwave plasma processing apparatus of the first exemplary embodiment further includes: a phase shifter installed in a specific waveguide of at least one of the plurality of waveguides to shift a phase of a voltage of the specific waveguide by a set shift amount. Apart from the control of the distribution ratio of the distributor, the control unit properly controls the phase of the voltage of the specific waveguide and phases of voltages of waveguides other than the specific waveguide among the plurality of waveguides using the monitor value of the voltage monitored by the monitor unit so as to control the shift amount of the phase shifter such that the phases become inverse phases in a dielectric window below the antenna.

In an exemplary embodiment, the microwave plasma processing apparatus of the first exemplary embodiment further includes a waveguide guiding the microwave generated by the microwave generator to the distributor, and a tuner installed in the waveguide to match impedance at the microwave generator side and impedance of the antenna side.

In an exemplary embodiment, the microwave plasma processing apparatus of the first exemplary embodiment is provided with a plurality of sets of processing containers and the antennas. The distributor distributes microwaves to the plurality of waveguides corresponding to the plurality of sets of processing containers and antennas, respectively. The antenna radiates the microwaves distributed to each of the plurality of waveguides by the distributor to the processing space of the processing container combined with the antenna. The control unit controls the distribution ratio of the distributor based on the control value acquired from the storage unit.

In an exemplary embodiment, the microwave plasma processing apparatus is provided with a plurality of distributors. The plurality of distributors distribute the microwaves generated by the microwave generator to the plurality of waveguides stepwise sequentially. For each distributor, the storage unit stores the difference and a control value of the distribution ratio of the distributor corresponding to the difference to correspond to each other. The control unit individually controls the distribution ratio of each of the plurality of distributors based on the control value acquired from the storage unit.

In addition, a microwave supplying method according to the first exemplary embodiment uses a microwave plasma processing apparatus including: a processing container configured to defined a processing space; a microwave generator configured to generate microwaves for generating plasma of a processing gas introduced into the processing space; a distributor configured to distribute the microwaves to a plurality of waveguides; and an antenna installed in the processing container so as to seal the processing space and to radiating, to the processing space, the microwaves distributed to the plurality of waveguides by the distributor. The method includes: monitoring a voltage of each of the plurality of waveguides; acquiring a control value of a distribution ratio of the distributor corresponding to a difference between a monitor value of the monitored voltage and a predetermined reference value of the voltage from a storage unit which stores the difference and the control value of the distribution ratio of the distributor corresponding to the difference to correspond to each other; and controlling the distribution ratio of the distributor based on the acquired control value.

(Microwave Plasma Processing Apparatus according to First Exemplary Embodiment)

Figure 2:
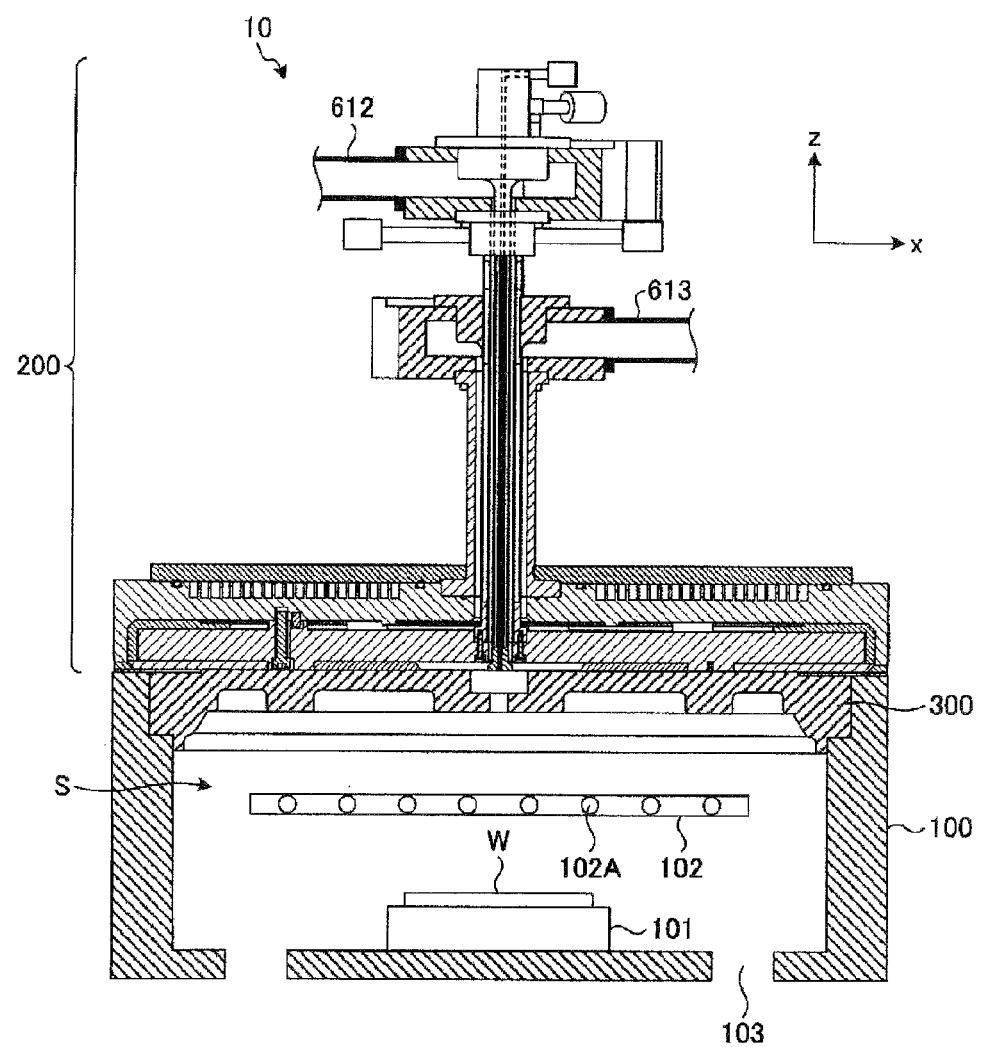
FIG. 2 is a view illustrating an example of an internal configuration of the microwave plasma processing apparatus according to the first exemplary embodiment.

FIG. 1 is a diagram illustrating one example of an external configuration of a microwave plasma processing apparatus according to a first exemplary embodiment. FIG. 2 is a view illustrating an example of an internal configuration of the microwave plasma processing apparatus according to the first exemplary embodiment. Meanwhile, in FIG. 2, a part of the microwave plasma processing apparatus is omitted for the convenience of description.

As illustrated in FIGS. 1 and 2, the microwave plasma processing apparatus 10 includes a processing container 100, a microwave generator 400, a distributor 500, a slot antenna 200, and a dielectric window 300. Further, the microwave plasma processing apparatus 10 includes, in the processing container 100, a support 101 on which a substrate W is mounted and a gas shower 102 configured to supply a processing gas into the processing container 100 from a gas supply source (not illustrated) through an opening 102A.

The processing container 100 defines a processing space S configured to perform a plasma processing on the substrate W placed on the support 101. In addition, the processing container 100 is formed with an opening 103 connected to an exhaust system such as a vacuum pump.

The microwave generator 400 generates microwaves for generating plasma of the processing gas supplied to the processing space S. Specifically, the microwave generator 400 includes a magnetron 402, in which when the magnetron 402 is oscillated in a state where a voltage is applied between negative and positive poles, microwaves are generated. A waveguide 602 is connected to the microwave generator 400 to connect the microwave generator 400 and the distributor 500. The waveguide 602 is connected to the distributor 500 to guide the microwave generated by the microwave generator 400 to the distributor 500.

An isolator 604, a directional coupler 606, and a tuner 608 are installed in the waveguide 602. In the isolator 604, reflected waves of the microwaves from the slot antenna 200 are separated by a circulator and the separated reflected waves are converted into heat by a dummy load. The directional coupler 606 branches a part of travelling waves and reflected waves of the microwaves and outputs the branched waves to a detector 610. The detector 610 converts the microwaves input from the directional coupler 606 into an analog signal and outputs the analog signal to the microwave generator 400. The analog signal output to the microwave generator 400 is used to control oscillation of the magnetron 402 of the microwave generator 400.

The tuner 608 matches impedance at the microwave generator 500 side and impedance at the slot antenna 200 side. The microwaves generated by the microwave generator 400 are propagated in the waveguide 602 and guided to the distributor 500, through the isolator 604, the directional coupler 606, and the tuner 608.

The distributor 500 distributes the microwaves input from the waveguide 602 to a plurality of waveguides. In the exemplary embodiment, the distributor 500 distributes the microwaves input from the waveguide 602 to two waveguides 612, 613. For example, the distributor 500 has a T-shaped waveguide which includes one input port and two output ports. When a position of a movable short-circuit plate installed in the T-shaped waveguide is moved, the microwaves input o the input port from the waveguide 602 are distributed to two waveguides 612, 613. Further, a distribution ratio used for the distribution of the microwaves by the distributor 500 is variable. A control value of the distribution ratio of the distributor 500 is input by, for example, a control unit 708 to be described below. That is, the distributor 500 distributes the microwaves input from the waveguide 602 to two waveguides 612, 613 by using the control value of the distribution ratio input by the control unit 708.

The slot antenna 200 is installed in the processing container 100 to seal the processing space S. The dielectric window 300 is installed on a processing container 100 side surface of the slot antenna 200. The slot antenna 200 has therein an inner waveguide and an outer waveguide which are two independent waveguides for transmitting microwaves. The inner waveguide and the outer waveguide are connected to the two waveguides 612, 613, respectively. The slot antenna 200 transmits the microwave distributed to the two waveguides 612, 613 by the distributor 500 to the dielectric window 300 through the inner waveguide and the outer waveguide, and radiates the transmitted microwaves to the processing space S through the dielectric window 300. The microwave radiated to the processing space S from the slot antenna 200 deionizes the processing gas supplied to the processing space S to excite plasma of the processing gas. An example of an overall configuration of the slot antenna 200 will be described below.

The microwave plasma processing apparatus 10 includes a storage unit 702, a monitor unit 704, a phase shifter 706, and a control unit 708, as illustrated in FIG. 1.

Figures 3, 4:
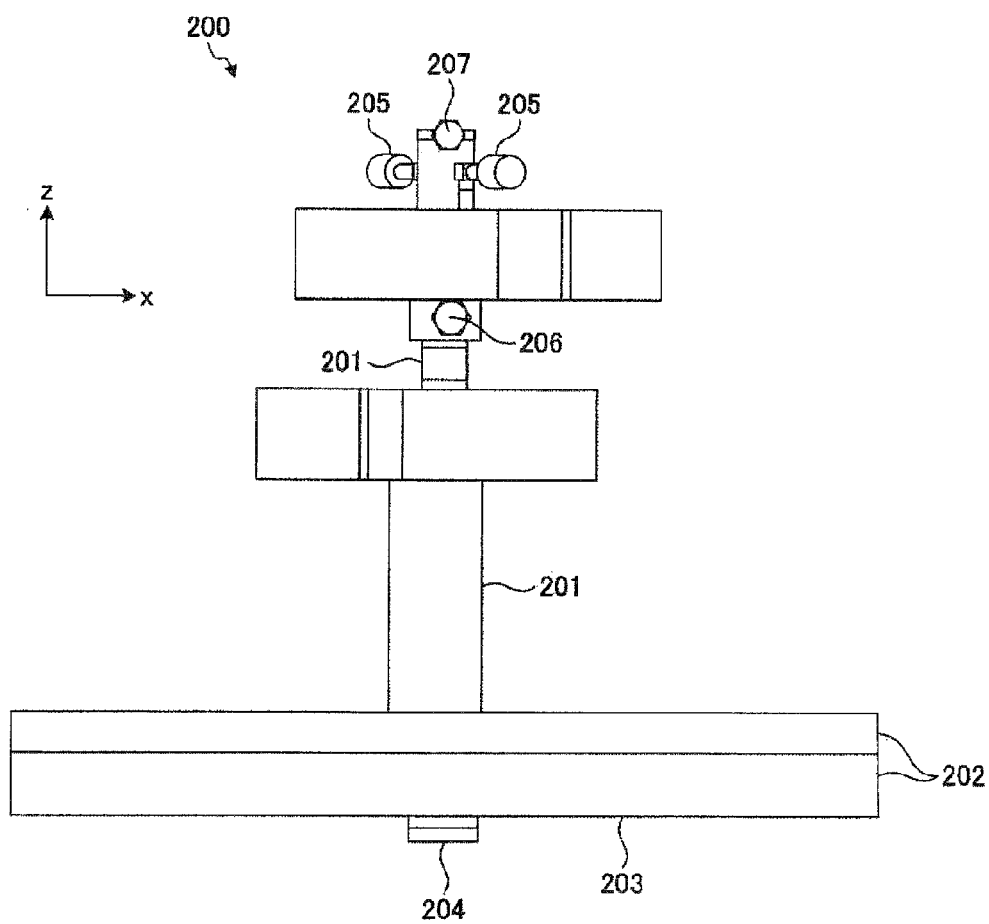
FIG. 3 is a table illustrating an example of information stored by a storage unit in the first exemplary embodiment.
FIG. 4 is a front view illustrating a slot antenna according to the first exemplary embodiment.

The storage unit 702 stores a monitor difference which is a difference between a monitor value of a voltage of each of the two waveguides 612, 613 which are distribution targets of the microwaves by the distributor 500 and a predetermined reference value of the voltage, and the control value of the distribution ratio of the distributor 500 corresponding to the monitor difference such that the monitor difference and the control value correspond to each other. FIG. 3 is a table illustrating an example of information stored by the storage unit in the first exemplary embodiment. For example, as illustrated in FIG. 3, the storage unit 702 stores monitor differences and control values to correspond to each other. Each monitor difference refers to a monitor difference which is a difference between a monitor value of a voltage of each of the two waveguides 612, 613 which are the distribution targets of the microwaves by the distributor 500 and a predetermined reference value of the voltage. Each control value refers to a control value of the distribution ratio of the distributor 500 corresponding to the monitor difference. For example, the storage unit 702 stores a monitor difference "D1" and a control value "C1" to correspond to each other. Further, the storage unit 702 stores a monitor difference "D2" and a control value "C2" to correspond to each other.

The monitor unit 704 monitors the voltage of each of the two waveguides 612, 213 using voltage sensors 622, 623 which are installed in two waveguides 612, 613, respectively, and outputs, to the control unit 708, a monitor value which is a detection result of a standing wave in the waveguide by monitoring the voltage of each of the two waveguides 612, 613. Here, monitor values, which are monitored by the monitor unit 704, may include, for example, Vpp which is a peak to peak value of voltage or Vdc which is an intermediate value of voltage. Vpp represents the magnitude of the standing wave generated in the waveguide and Vdc represents an offset amount of the standing wave generated in the waveguide.

The phase shifter 706 is installed in one waveguide 613 of the two waveguides 612, 613 and shifts the phase of the voltage of the waveguide 613 by a set shift amount. Further, the shift amount set in the phase shifter 706 is controlled by the control unit 708.

The control unit 708 acquires from the monitor unit 704 the monitor value of the voltage of each of the two waveguides 612, 613 which is monitored by the monitor unit 704. The control unit 708 calculates the monitor difference which is the difference between a monitor value and a reference value of the voltage of each of the two waveguides 612, 613. The reference value is input from, for example, an input interface (not illustrated) as a recipe requirement. Here, the control unit 708 may calculate, as the monitor difference, a difference between a monitor value and one reference value of the voltage of any one waveguide of the two waveguides 612, 613. Further, the control unit 708 may obtain an average value of the monitor values of the respective voltages of two waveguides 612, 613 and calculate a difference between the obtained average value and one reference value as the monitor difference. Further, the control unit 708 may obtain a ratio of the monitor values of the respective voltages of the two waveguides 612, 613 and calculate a difference between the obtained ratio and one reference value as the monitor difference. In addition, the control unit 708 acquires, from the storage unit 702, the control value of the distribution ratio of the distributor 500 corresponding to the calculated monitor difference, and controls the distribution ratio of the distributor 500 based on the acquired control value. For example, when the monitor difference is "D1", the control unit 708 acquires the control value "C1" from the storage unit 702 and outputs the acquired control value to the distributor 500.

Using the monitor values of the respective voltages of the two waveguides 612, 613, the control unit 708 controls the shift amount of the phase shifter 706 such that a phase of the voltage of the waveguide 612 and a phase of the voltage of the waveguide 613 are inverted to each other. That is, the control unit 708 properly sets the phase of the voltage of the waveguide 612 and the phase of the voltage of the waveguide 613 to offset the microwaves transmitted to a center side and a peripheral edge side of the dielectric window 300 from the two waveguides 612, 613 through the inner waveguide and the outer waveguide in the slot antenna 200 with the inverse phases.

Figure 5:
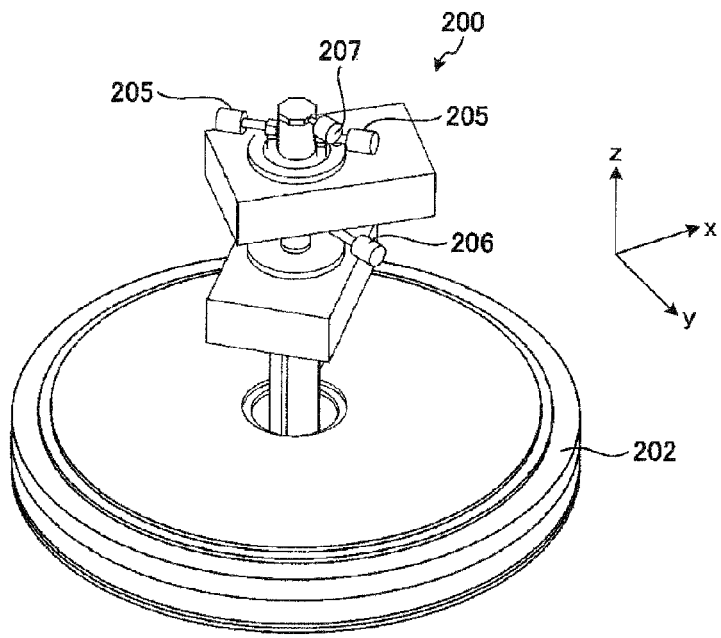
FIG. 5 is a perspective view illustrating the slot antenna when the slot antenna is viewed from an upper side.
Figure 6:
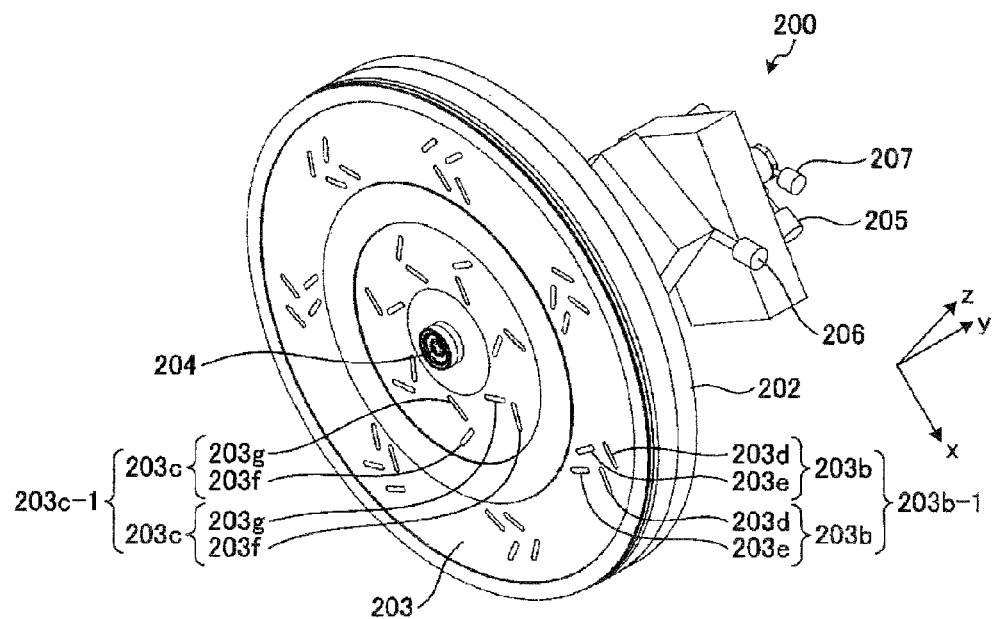
FIG. 6 is a perspective view illustrating the slot antenna when the slot antenna is viewed from a lower side.

Here, an example of the entire configuration of the slot antenna 200 illustrated in FIGS. 1 and 2 will be described. FIGS. 4 to 6 illustrate an entire external appearance of an example of a slot antenna in the first exemplary embodiment. In the example illustrated in FIGS. 4 to 6, the dielectric window 300 is not illustrated for the convenience of description. As illustrated in FIGS. 4 to 6, the slot antenna 200 includes a coaxial waveguide 201, a cooling plate 202, a slot antenna plate 203, a gas supply hole 204 configured to supply a processing gas to the inside of the processing container 100, cooling tubes 205, 206 configured to cool the coaxial waveguide 201, and a gas inlet hole 207 through which the processing gas is supplied to the slot antenna 200.

The slot antenna plate 203 has, for example, a thin plate shape, in particular, a disc shape. The slot antenna plate 203 is formed with a plurality of microwave transmission slots 203*c* and a plurality of microwave transmission slots 203*b*. It is preferable that each of the opposite surfaces of the slot antenna plate 203 in the plate thickness direction is flat. The plurality of microwave transmission slots 203*c* are formed on an inner periphery side of the slot antenna plate 203 and the plurality of microwave transmission slots 203*b* are formed on an outer periphery side of the slot antenna plate 203. The microwave transmission slots 203*b*, 203*c* are formed through the slot antenna plate 203 in the plate thickness direction. Each of the plurality of microwave transmission slots 203*c* includes two slots 203*f*, 203*g* which are elongated holes extending to intersect or cross at right angles each other. Each of the plurality of microwave transmission slots 203*b* includes two slots 203*d*, 203*e* which are elongated holes extending to intersect or cross at right angles each other. The plurality of microwave transmission slots 203*c* are arranged at predetermined intervals in the circumferential direction of the inner periphery side, and the plurality of microwave transmission slots 203*b* are arranged at predetermined intervals in the circumferential direction of the outer periphery side.

In other words, the plurality of microwave transmission slots 203*c* becomes an inner slot group 203*c*-1 which is formed by a plurality of slot pairs 203*f*, 203*g* arranged along the circumferential direction of the slot antenna plate 203. In addition, the plurality of microwave transmission slots 203*b* becomes an outer slot group 203*b*-1 which is positioned outside the inner slot group 203*c*-1 in the radial direction of the slot antenna plate 203 and formed by a plurality of slot pairs 203*d*, 203*e* arranged along the circumferential direction of the slot antenna plate 203.

The inner slot group 203*c*-1 transmits microwaves guided to the center side of the dielectric window 300 by an inner waveguide to be described later, and the outer slot group 203*b*-1 transmits microwaves guided to the peripheral edge side of the dielectric window 300 by an outer waveguide to be described later.

Figure 7:
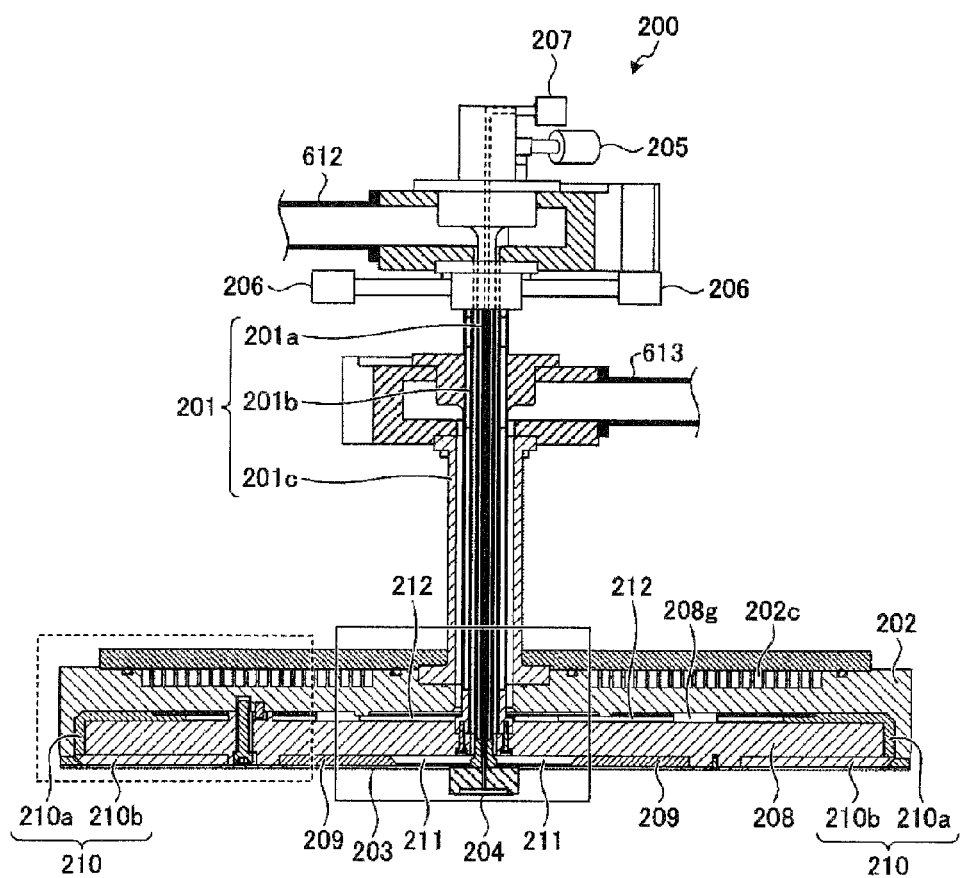
FIG. 7 is a cross-sectional view illustrating an example of a detailed configuration of the slot antenna in the first exemplary embodiment.
Figure 8:
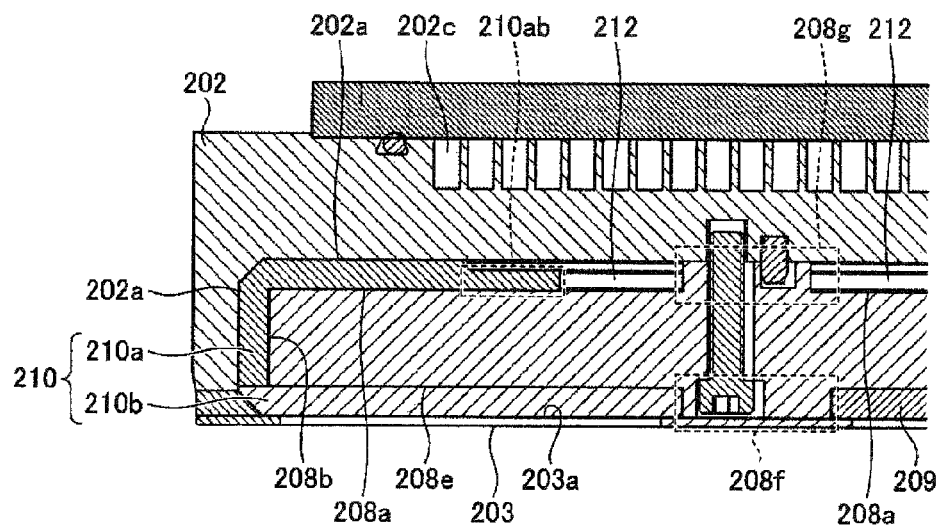
FIG. 8 is a cross-sectional view illustrating a portion of the cross-sectional view of the slot antenna illustrated in FIG. 7 in an enlarged scale.
Figure 9:
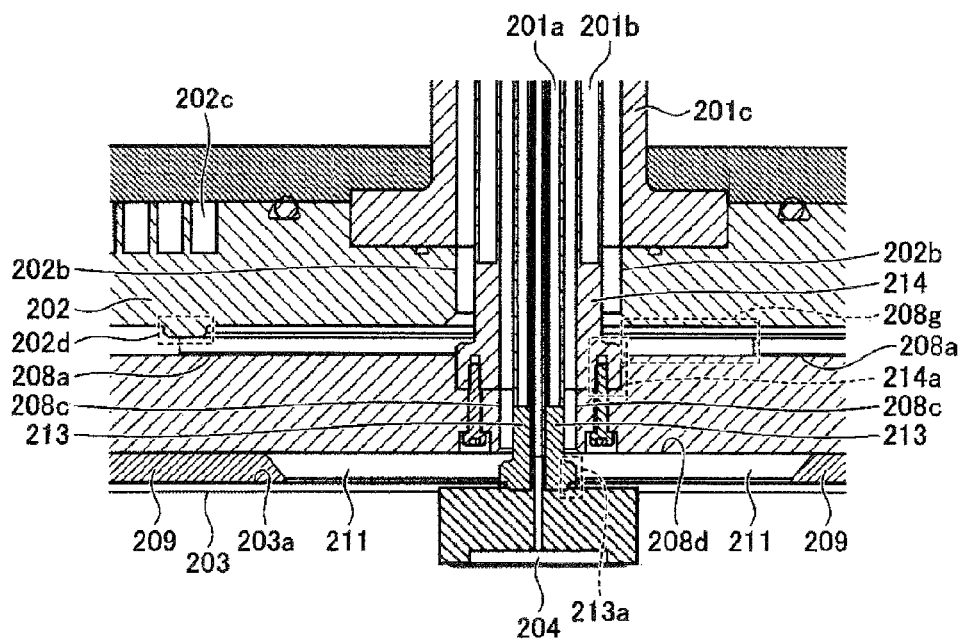
FIG. 9 is a cross-sectional view illustrating a portion of the cross-sectional view of the slot antenna illustrated in FIG. 7 in an enlarged scale.

FIG. 7 is a cross-sectional view illustrating an example of a detailed configuration of the slot antenna in the first exemplary embodiment. FIGS. 8 and 9 are cross-sectional views illustrating portions of the cross-sectional view of the slot antenna illustrated in FIG. 7 in an enlarged scale. FIGS. 8 and 9 correspond to the portions surrounded by a solid line and a dotted line in FIG. 7, respectively. As illustrated in FIGS. 8 and 9, the slot antenna 200 includes a cooling plate 202, an intermediate metal body 208, a slot antenna plate 203, and a coaxial waveguide 201.

As illustrated in FIGS. 7 to 9, the cooling plate 202 is installed to be spaced apart from an outer surface of an intermediate conductor 201*b* of the coaxial waveguide 201 which will be described later. The cooling plate 202 includes a flow hole 202*c* to circulate a coolant. The cooling plate 202 is used for cooling the intermediate metal body 208 and the dielectric window 300.

The intermediate metal body 208 is installed to be spaced apart from the processing container 100 side of the cooling plate 202. The intermediate metal body 208 has a donut-shaped convex portion 208*f* that separates the processing container 100 side surface of the intermediate metal body 208 into a center side portion and an outer periphery side portion. In addition, it is preferable that the intermediate metal body 208 has a uniform thickness. More specifically, it is preferable that the thickness of the intermediate metal body 208 is uniform, except for the area where the convex portion 208*f* is formed.

The slot antenna plate 203 is installed to be in contact with the convex portion 208*f* on the processing container 100 side of the intermediate metal body 208. On the processing container 100 side surface of the slot antenna plate 203, the slot antenna plate 203 includes, as slots for radiating microwaves, the microwave transmission slots 203*c* formed in a more center side portion than the portion which is in contact with the convex portion 208*f*, and the microwave transmission slots 203*b* formed in a more outer periphery side portion than the portion which is in contact with the convex portion 208*f*.

The coaxial waveguide 201 is installed in a through hole which continuously extends through the cooling plate 202 and the intermediate metal body 208. In the example illustrated in FIG. 7, the processing container 100 side end of the coaxial waveguide 201 is positioned within the through hole. The through hole is formed in the center side portion defined by the convex portion 208*f* on the intermediate metal body 208.

In addition, the coaxial waveguide 201 includes an inner conductor 201a, an intermediate conductor 201b, and an outer conductor 201c. Each of the inner conductor 201a, the intermediate conductor 201b, and the outer conductor 201c has a cylindrical shape, and may be installed such that the diametric centers thereof conform to each other. The inner conductor 201a and the intermediate conductor 201b are installed such that the outer surface of the inner conductor 201a and the inner surface of the intermediate conductor 201b are spaced apart from each other. In addition, the intermediate conductor 201b and the outer conductor 201c are installed such that the outer surface of the intermediate conductor 201b and the inner surface of the outer conductor 201c are spaced apart from each other.

A mode converter 215 is connected to one waveguide 612 of the two waveguides which are the microwave distribution targets of the distributor 500 and connected to a space between the inner conductor 201a and the intermediate conductor 201b installed in a hollow portion of an intermediate conductor 201b. The mode converter 215 converts a mode of the microwaves transmitted from the waveguide 612 and supplies the microwaves after the mode conversion to the space between the inner conductor 201a and the intermediate conductor 201b.

A mode converter 216 is connected to the other waveguide 613 of the two waveguides which are the microwave distribution targets of the distributor 500 and connected to a space between the intermediate conductor 201b and an outer conductor 201c installed in a hollow portion of the outer conductor 201c. The mode converter 216 converts the mode of the microwave transmitted from the waveguide 613 and supplies the microwave after the mode conversion to the space between the intermediate conductor 201b and the outer conductor 201c.

Here, in the coaxial waveguide 201, the hollow portion of the inner conductor 201a forms a supply path that supplies the processing gas introduced into the gas supply hole 204 to the gas inlet hole 207. In addition, in the coaxial waveguide 201, microwaves from each of the waveguides 612, 623 are transmitted by each of a space between the inner conductor 201a installed in the hollow portion of the intermediate conductor 201b and the intermediate conductor 201b, and a space between the intermediate conductor 201b installed in the hollow portion of the outer conductor 201c and the outer conductor 201c. That is, the microwaves are transmitted by each of the hollow portion formed by the outer surface of the inner conductor 201a and the inner surface of the intermediate conductor 201b, and the hollow portion formed by the outer surface of the intermediate conductor 201b and the inner surface of the outer conductor 201c.

A first member 213 and a second member 214 are installed at an end of the coaxial waveguide 201. For example, the first member 213 is installed at a processing container 100 side end of the inner conductor 201a of the coaxial waveguide 201. The first member 213 including a through hole has a first stepped portion 213a protruding to a center side space positioned at the more center side than the convex portion 208f in the space between the slot antenna plate 203 and the intermediate metal body 208. The length of the diameter of the first member 213 at the first stepped portion 213a is equal to or smaller than the inner diameter of the intermediate conductor 201b. In addition, in the example illustrated in FIG. 9, the first member 213 is fixed to the gas supply hole 204.

In addition, for example, the second member 214 is installed at the processing container 100 side end of the intermediate conductor 201b of the coaxial waveguide 201. The second member 214 including a through hole has a third stepped portion 214a protruding to the space between the intermediate metal body 208 and the cooling plate 202. The length of the diameter of the second member 214 at the third stepped portion 214a is equal to or smaller than the inner diameter of the outer conductor 201c. In addition, in the example illustrated in FIG. 9, the second member 214 is fixed to the intermediate metal body 208.

As illustrated in FIG. 9, each of the first member 213 and the second member 214 has a stepped shape rather than a tapered shape. In addition, the first member 213 is installed to be spaced apart from the intermediate metal body 208, and the second member 214 is installed to be spaced apart from the cooling plate 202.

An example of a relationship of the through holes, the coaxial waveguide 201, the first member 213, and the second member 214 will be additionally described. In the example illustrated in FIG. 9, the inner conductor 201a of the coaxial waveguide 201 extends through the through hole formed in the cooling plate 202. In addition, the end of the intermediate conductor 201b is positioned inside the through hole of the cooling plate 202, and the second member 214 is installed at the end of the intermediate conductor 201b. In addition, the end of the outer conductor 201c of the coaxial waveguide 201 is fixed to the cooling plate 202.

In addition, in the example illustrated in FIG. 9, the end of the inner conductor 201a of the coaxial waveguide 201 is positioned inside the through hole of the intermediate metal body 208, and the first member 213 is installed at the end of the inner conductor 201a. In addition, a gap exists between the intermediate conductor 201b of the coaxial waveguide 201 and the side surface 202b of the through hole of the cooling plate 202, a gap exists between the inner conductor 201a of the coaxial waveguide 201 and the side surface 208c of the through hole of the intermediate metal body 208, and each of the gaps forms a portion of a waveguide that transmits microwaves.

Figure 10:
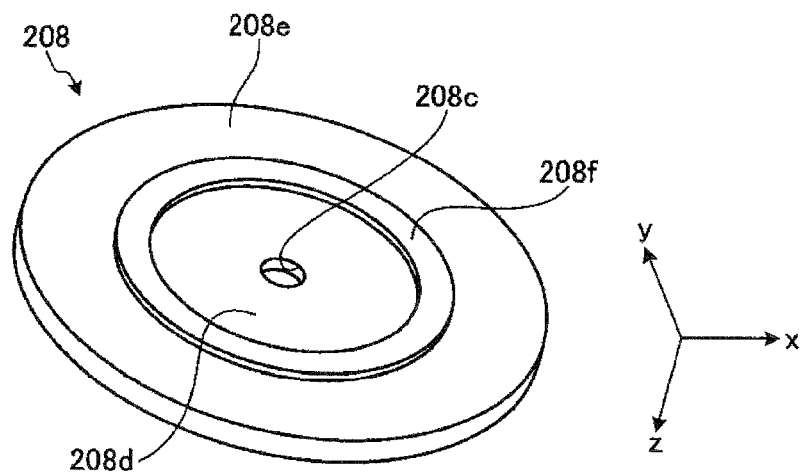
FIG. 10 is a perspective view illustrating an example of the intermediate metal body in the first exemplary embodiment which is viewed from the dielectric window side.
Figure 11:
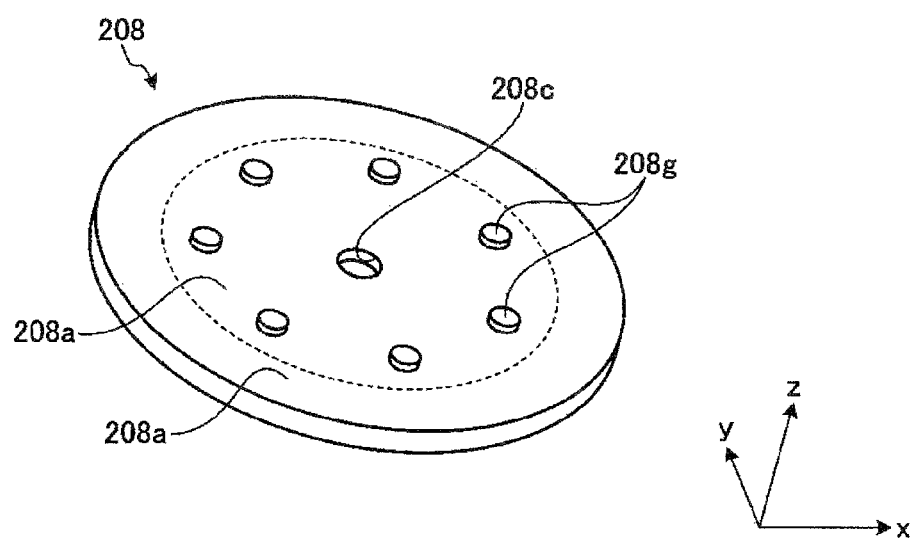
FIG. 11 is a perspective view illustrating an example of the intermediate metal body in the first exemplary embodiment which is viewed from the cooling plate side.

FIG. 10 is a perspective view illustrating an example of the intermediate metal body in the first exemplary embodiment which is viewed from the dielectric window side. FIG. 11 is a perspective view illustrating an example of the intermediate metal body in the first exemplary embodiment which is viewed from the cooling plate side.

Here, the intermediate metal body 208 will be further described with reference to FIGS. 10 and 11. As illustrated in FIG. 108, the intermediate metal body 208 includes a donut-shaped convex portion 208f. As a result, the intermediate metal body 208 is in contact with the slot antenna plate 203 on the donut-shaped convex portion 208f. In other words, the donut-shaped convex portion 208f of the intermediate metal body 208 is formed on the top surface of the slot antenna plate 203.

Here, in the intermediate metal body 208, a center side space is formed between the bottom surface 208d of the intermediate metal body 208 and the top surface 203a of the slot antenna plate 203 in a range from the center side of the intermediate metal body 208 to the donut-shaped convex portion 208f. In the example illustrated in FIG. 7, the center side space corresponds to a space where an inner slow-wave plate 209 to be described later is installed and an empty space 211. In addition, in the intermediate metal body 208, an outer periphery side space is formed between the bottom surface 208e of the intermediate metal body 208 and the top surface 203a of the slot antenna plate 203 in a range from the outer periphery of the intermediate metal body 208 to the donut-shaped convex portion 208f of the intermediate metal body 208. In the example illustrated in FIG. 7, the outer periphery side space corresponds to a space where an outer slow-wave plate 210b to be described later is installed.

In addition, as illustrated in FIG. 11, the intermediate metal body 208 includes a cooling plate 202 and one or plural convex portions 208g. Here, the intermediate metal body 208 is in contact with the cooling plate 202 in the one or plural convex portions 208g. In other words, the cooling plate 202 is installed on the one or plural convex portions 208g of the intermediate metal body 208. That is, the intermediate metal body 208 and the cooling plate 202 are installed such that the outer surface of the intermediate metal body 208 and the cooling plate 202 are spaced apart from each other, except for the one or plural convex portions 208g. In other words, the bottom surface 202a of the cooling plate and the top surface 208a and the side surface 208b of the intermediate metal body 208 are spaced apart from each other, except for the one or plural convex portions 208g.

Here, the cooling plate 202 has a convex portion 202d protruding to the space between the intermediate metal body 208 and the cooling plate 202. The convex portion 202d is not in contact with the intermediate metal body 208.

In addition, the intermediate metal body 208 and the cooling plate 202 are in contact with each other through the one or plural convex portions 208g formed on the intermediate metal body 208. In other words, the intermediate metal body 208 and the cooling plate 202 are installed to be spaced apart from each other, except for the one or plural convex portions 208g of the intermediate metal body 208. Meanwhile, the intermediate metal body 208 is formed with a flow hole connected to the flow holes 202c of the cooling plate 202 through the one or plural convex portions 208g where the cooling plate 202 and the intermediate metal body 208 are in contact with each other, thereby enhancing the cooling performance of the intermediate metal body 208. In addition, it is preferable that the one or plural convex portions 208g are formed at an area where the outer slow-wave plate 210 is not installed.

In addition, the slot antenna 200 is provided with a slow-wave plate at a portion on the outer surface of the intermediate metal body 208. Specifically, the slot antenna 200 is provided with an inner slow-wave plate 209 and an outer slow-wave plate 210.

Figure 12:
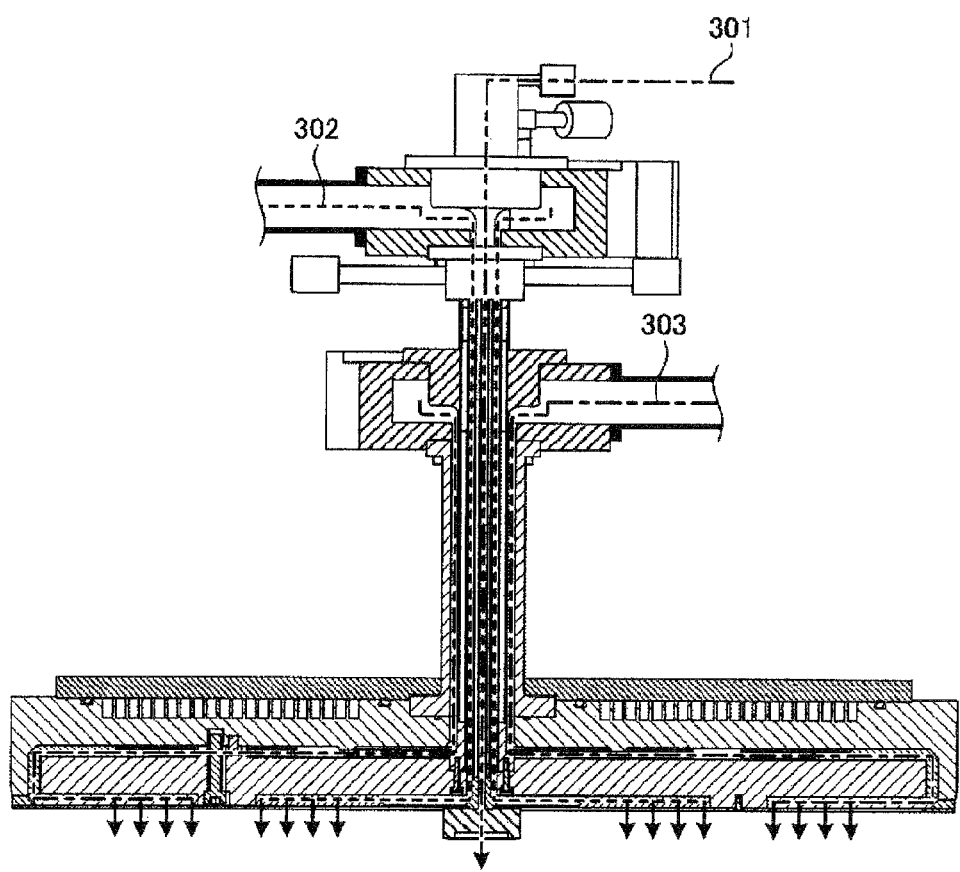
FIG. 12 is a view illustrating a processing gas supply path and a microwave waveguide formed in the slot antenna in the first exemplary embodiment.

FIG. 12 is a view illustrating a processing gas supply path and a microwave waveguide installed in the slot antenna in the first exemplary embodiment. In FIG. 12, arrow 301 represents the processing gas supply path formed in the slot antenna 200, arrow 302 represents the waveguide of microwaves supplied to an inner slot group 203c-1 installed on the inner periphery side of the slot antenna plate 203, and arrow 303 represents a waveguide of microwaves supplied to an outer slot group 203b-1 installed on the outer periphery side of the slot antenna plate 203.

As indicated in an arrow 301 of FIG. 12, in the slot antenna 200, when the processing gas is supplied to the gas inlet hole 207 from the processing gas supply source (not illustrated), the processing gas is supplied to the inside of the processing container 100 from the gas supply hole 204 through a hollow portion of the inner conductor 201a that extends through the cooling plate 202 and the intermediate metal body 208.

In addition, as indicated by arrow 302 in FIG. 12, the slot antenna 200 includes an inner waveguide which is a waveguide that transmits microwaves to the microwave transmission slots 203c (inner slot group 203c-1) by transmitting the microwaves to the center side space, which is positioned at the more center side than the convex portion 208f in the space between the slot antenna plate 203 and the intermediate metal body 208, through the space between the inner conductor 201a and the intermediate conductor 201b. In addition, the inner waveguide is provided with an inner slow-wave plate 209 above the microwave transmission slots 203c (inner slot group 203c-1).

That is, in the inner waveguide, the microwaves supplied from the waveguide 612 sequentially pass through the hollow portion formed by the outer surface of the inner conductor 201a and the inner surface of the intermediate conductor 201b, the hollow portion formed by the outer surface of the inner conductor 201a and the side surface 208c of the through hole formed in the intermediate metal body 208, the space between the first member 213 and the intermediate metal body 208, the empty space 212 formed by the bottom surface of the intermediate metal body 208 and the top surface of the slot antenna plate 203, and the inner slow-wave plate 209, and then, the microwaves are discharged to the center side of the dielectric window 300 from the microwave transmission slots 203c (inner slot group 203c-1).

In addition, as indicated by arrow 303 in FIG. 12, the slot antenna 200 includes an outer waveguide which is a waveguide that transmits microwaves to the microwave transmission slots 203b (outer slot group 203b-1) by transmitting the microwaves to the outer periphery side space positioned at the more outer periphery side than the convex portion 208f in the space between the slot antenna plate 203 and the intermediate metal body 208 sequentially through the space between the intermediate conductor 201b and the outer conductor 201c and the space between the intermediate metal body 208 and the cooling plate 202. The outer waveguide is provided with an outer slow-wave plate 210 above the microwave transmission slots 203b (outer slot group 203b-1). In addition, the inner waveguide and the outer waveguide are not communicated with each other That is, in the outer waveguide, the microwaves supplied from the waveguide 613 sequentially pass through the hollow portion formed by the outer surface of the intermediate conductor 201b and the inner surface of the outer conductor 201c, the hollow portion formed by the outer surface of the intermediate conductor 201b and the side surface 202b of the cooling plate 202, the space between the second member 214 and the cooling plate 202, the empty space 211 formed by the top surface 208a of the intermediate metal body 208 and the bottom surface 202a of the cooling plate 202, the outer slow-wave plate 210a, and the outer slow-wave plate 210b, and then, the microwaves are discharged to the periphery edge side of the dielectric window 300 from the microwave transmission slots 203b (outer slot group 203b-1).

When the inner waveguide and the outer waveguide are not communicated with each other as described above, the interference of the microwaves between the inner waveguide and the outer waveguide may be avoided.

Meanwhile, although the first exemplary embodiment illustrates an example in which the inner waveguide and the outer waveguide are not communicated with each other, the present disclosure is not limited thereto. The inner waveguide and the outer waveguide may be communicated with each other through a through hole which does not transmit microwaves.

Figure 13:
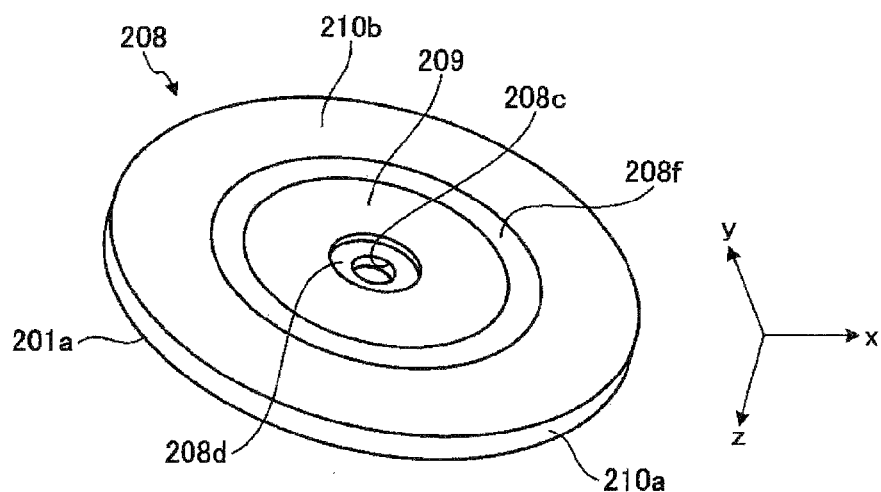
FIG. 13 is a perspective view illustrating a relationship of the intermediate metal body, the inner slow-wave plate, and the outer slow-wave plate in the first exemplary embodiment which is viewed from the dielectric window side.
Figure 14:
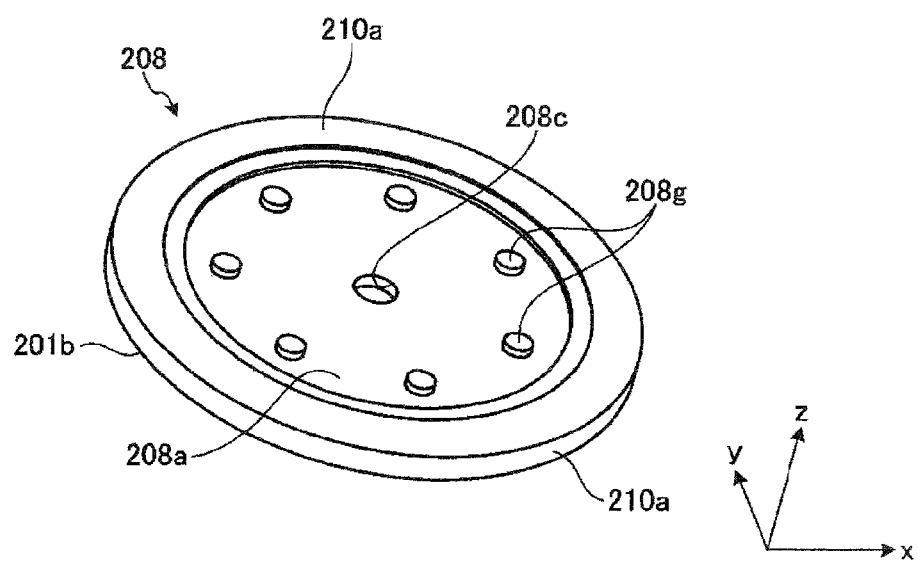
FIG. 14 is a perspective view illustrating a relationship of the intermediate metal body, the inner slow-wave plate, and the outer slow-wave plate in the first exemplary embodiment which is viewed from the cooling plate side.

FIG. 13 is a perspective view illustrating a relationship of the intermediate metal body, the inner slow-wave plate, and the outer slow-wave plate in the first exemplary embodiment which is viewed from the dielectric window side. FIG. 14 is a perspective view illustrating a relationship of the intermediate metal body, the inner slow-wave plate, and the outer slow-wave plate in the first exemplary embodiment which is viewed from the cooling plate side.

As illustrated FIGS. 11 and 12, the inner slow-wave plate 209 is installed in a portion of or all over the center side space including the upper portion of the microwave transmission slots 203c. In addition, the inner slow-wave plate 209 has an inclination or step on an interface between the inner slow-wave plate 209 and the empty space 211 in which the inner slow-wave plate 209 is not provided, preferably in the center side space.

That is, as illustrated in FIGS. 7 to 14, the inner slow-wave plate 209 is installed over a predetermined length toward the inner periphery side from the convex portion 208f of the intermediate metal body 208 to fill the space formed between the bottom surface 208d of the intermediate metal body 208 and the top surface 203a of the slot antenna plate 203. As a result, in the portion existing in the inner periphery side from the convex portion 208f of the intermediate metal body 208 in the space formed between the bottom surface 208d of the intermediate metal body 208 and the top surface 203a of the slot antenna plate 203, the inner slow-wave plate 209 is installed in a predetermined length range from the convex portion 208f of the intermediate metal body 208, and the empty space 211 is formed from the through hole of the intermediate metal body 208 to the portion where the inner slow-wave plate 209 is installed. In addition, the inner slow-wave plate 209 has preferably an inclined shape in the interface with the space 211.

As illustrated in FIGS. 13 and 14, the outer slow-wave plate 210 is installed to be continued in the outer periphery side space and a portion of the space between the intermediate metal body 208 and the cooling plate 202. For example, the outer slow-wave plate 210 includes a first outer slow-wave plate 210b installed in the outer periphery side space, and a second outer slow-wave plate 210a installed to be continued from an end of the first outer slow-wave plate 210b and installed in a portion of the space between the intermediate metal body 208 and the cooling plate 202.

That is, as illustrated in FIGS. 7 to 14, the outer slow-wave plate 210b is installed to fill the space formed between the bottom surface 208e of the intermediate metal body 208 and the top surface 203a of the slot antenna plate 203. In addition, the outer slow-wave plate 210a is installed over a predetermined length from the end of the outer slow-wave plate 210b to fill the space formed between the bottom surface 202a of the cooling plate 202 and the top surface 208a and the side surface 208b of the intermediate metal body 208.

In addition, the outer slow-wave plate 210a is installed to a predetermined length range from the outer periphery of the intermediate metal body 208 on the top surface 208a of the intermediate metal body 208. As a result, in the space formed between the top surface 208a of the intermediate metal body 208 and the bottom surface 202a of the cooling plate 202, an empty space 212 is formed from the through hole of the intermediate metal body 208 to the portion where the outer slow-wave plate 210a is installed. The one or plural convex portions 208g where the cooling plate 202 and the intermediate metal body 208 are in contact with each other are formed in the empty space 212 from the through hole of the intermediate metal body 208 to the portion where the outer slow-wave plate 210a is installed. In addition, the outer slow-wave plate 210 has a second stepped portion 210ab protruding toward the center side in the interface between the outer slow-wave plate 210 and the portion where the outer slow-wave plate 210 is not installed in the space between the intermediate metal body 208 and the cooling plate 202. Preferably, the length of the outer slow-wave plate 210 installed in the inner waveguide is longer than the length of the inner slow-wave plate 209 installed in the outer waveguide.

Descriptions will be described on a relationship between the outer waveguide, and the one or plural convex portions 208g formed on the intermediate metal body 208. As described above, the intermediate metal body 208 and the cooling plate 202 are in contact with each other in the one or plural convex portions 208g formed on the intermediate metal body 208. Here, the one or plural convex portions 208g are formed in the empty space 211. In other words, the one or plural convex portions 208g are not enclosed by the outer slow-wave plate 210.

Figure 15:
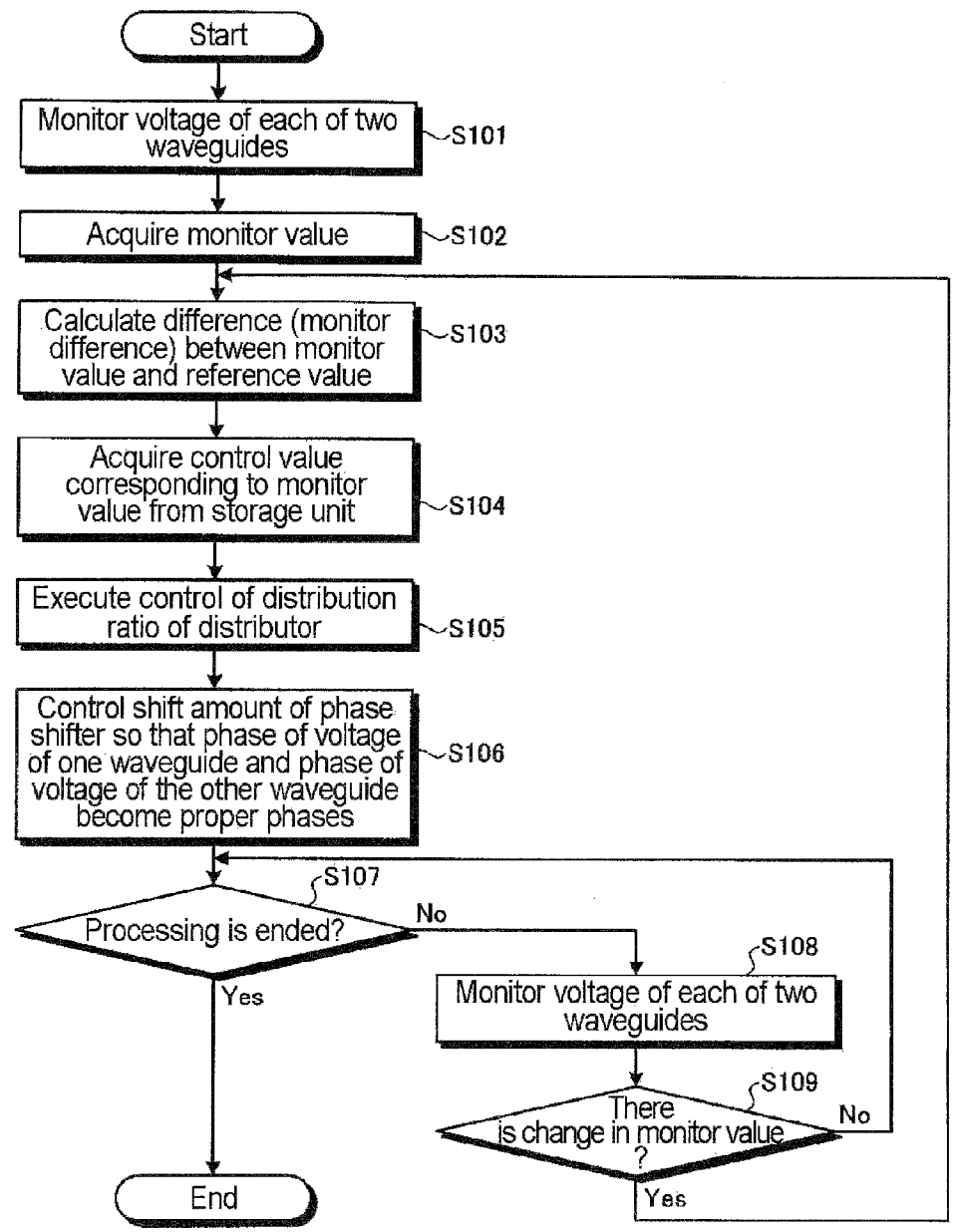
FIG. 15 is a flowchart illustrating an example of a flow of a plasma supplying method according to the first exemplary embodiment.

Subsequently, a plasma supplying method using the microwave plasma processing apparatus 10 illustrated in FIG. 1 will be described. FIG. 15 is a flowchart illustrating an example of a flow of a plasma supplying method according to the first exemplary embodiment.

As illustrated in FIG. 15, the monitor unit 704 monitors the voltage of each of the two waveguides 612, 613, using the voltage sensors 622, 623 installed in two waveguides 612, 613, respectively (step S101). Monitor values of voltage monitored by the monitor unit 704 may include, for example, Vpp which is a peak to peak value of voltage, and Vdc which is an intermediate value of voltage may be used. Referring to Vpp as an example, the monitor unit 704 detects the Vpp value as the monitor value.

The control unit 708 acquires a monitor value obtained through a monitoring by the monitor unit 704 (step S102). In addition, the control unit 708 calculates a monitor difference which is a difference between the acquired monitor value and a reference value (step S103). In addition, the control unit 708 acquires, from the storage unit 702, a control value of a distribution ratio corresponding to the calculated monitor difference (step S104). In addition, the control unit 708 executes a control of a distribution ratio of the distributor 500 based on the control value of the distribution ratio acquired from the storage unit 702 (step S105). For example, the control unit 708 acquires the Vpp value from the monitor unit 704 to calculate a monitor difference "D1" which is a difference between the acquired Vpp value and a reference value and acquires, from the storage unit 702, a control value "C1" corresponding to the calculated monitor difference from the storage unit 702 and output the acquired control value to the distributor 500. At this time, the distributor 500 distributes microwaves input from the waveguide 602 to two waveguides 612, 613, using the acquired control value.

Using the acquired monitor value, the control unit 708 controls a shift amount of the phase shifter 706 so that a phase of the voltage of the waveguide 612 and a phase of the voltage of the waveguide 613 become proper phases (step S106). The appropriate phases refer to phases inverted to offset microwaves transmitted to the center side and the peripheral edge side of the dielectric window 300.

When the processing is ended (step S107, Yes), the control unit 708 terminates the execution of the plasma supply processing. Meanwhile, when the processing is not ended (step S107, No), the control unit 708 monitors the voltage of each of the two waveguides 612, 613 again (step S108). In addition, the control unit 708 determines whether there is a change in the monitor values (step S109). When there is a change in the monitor values (step S109, Yes), the control unit 708 executes the processing subsequent to step S103 so as to dynamically optimize the distribution ratio.

Meanwhile, when there is no change in the monitor values (step S109, No), the control unit 708 returns the processing to step S107.

As described above, the microwave plasma processing apparatus 10 of the first exemplary embodiment includes a distributor configured to distribute microwaves to two waveguides connected to the inner waveguide and the outer waveguide of the slot antenna 200 and acquires, from a storage unit, a control value of the distributor corresponding to the monitor values of the voltages of the two waveguides, and controls the distribution ratio of the distributor using the acquired control value. Due to this, the microwave plasma processing apparatus 10 may individually radiate the microwaves from the inner slot group and the outer slot group of the slot antenna 200 to the processing space S while distributing the microwaves to the inner waveguide and the outer waveguide of the slot antenna 200 at an optimal distribution ratio. As a result, the microwave plasma processing apparatus 10 may maintain distribution uniformity of plasma excited by the microwaves in the processing space S in the processing container.

The microwave plasma processing apparatus 10 of the first exemplary embodiment shifts the phase of one waveguide using the monitor values of the voltages of the two waveguides connected to the inner waveguide and the outer waveguide of the slot antenna 200, so that the phases of the voltages of the two waveguides become appropriate phases to each other. Due to this, the microwave plasma processing apparatus 10 may suppress the interference of the microwaves guided to the dielectric window 300 from two waveguides connected to the inner waveguide and the outer waveguide of the slot antenna 200 through the inner waveguide and the outer waveguide of the slot antenna 200 by inverting the phases of the microwaves in the dielectric window below the antenna. As a result, the microwave plasma processing apparatus 10 may more appropriately maintain distribution uniformity of plasma excited by the microwaves in the processing space S in the processing container.

In the first exemplary embodiment, the tuner 608 matches impedance at the microwave generator 500 side and impedance at the slot antenna 200 side. As a result, the microwave plasma processing apparatus 10 may more appropriately maintain distribution uniformity of plasma excited by the microwave in the processing space S in the processing container.

Modified Example 1

Figure 16:
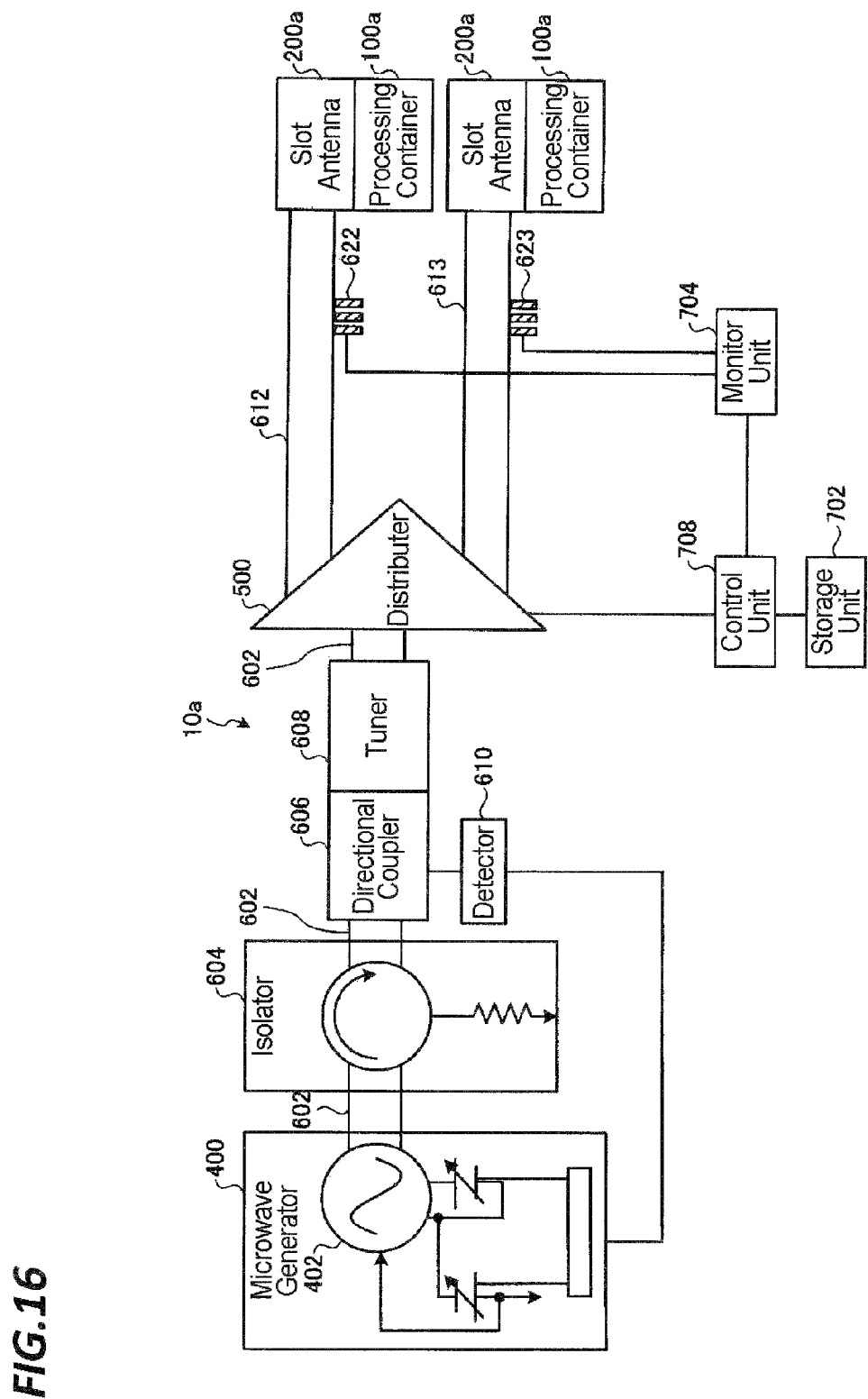
FIG. 16 is a diagram illustrating an example of an external configuration of Modified Example 1 of the microwave plasma processing apparatus according to the first exemplary embodiment.

Subsequently, Modified Example 1 of the microwave plasma processing apparatus according to the first exemplary embodiment will be described. FIG. 16 is a diagram illustrating an example of an external configuration of Modified example 1 of the microwave plasma processing apparatus according to the first exemplary embodiment. The microwave plasma processing apparatus 10a according to Modified Example 1 is different from the microwave plasma processing apparatus 10 illustrated in FIG. 1 in that a plurality of sets of processing containers and slot antennas are provided and the distributor 500 distributes microwaves to a plurality of waveguides which correspond to the plurality of sets of processing containers and slot antennas, respectively. Therefore, in FIG. 16, descriptions on the same configuration as the microwave plasma processing apparatus 10 illustrated in FIG. 1 will be omitted.

As illustrated in FIG. 16, the microwave plasma processing apparatus 10a according to Modified Example 1 includes a plurality of sets of processing containers 100a and slot antennas 200a instead of the processing container 100 and the slot antenna 200 illustrated in FIG. 1. In Modified Example 1, the microwave plasma processing apparatus 10a includes two sets of processing containers 100a and slot antennas 200a.

The distributor 500 distributes microwaves to the plurality of waveguides corresponding to the plurality of sets of processing containers 100a and slot antennas 200a, respectively. In Modified Example 1, the distributor 500 distributes the microwaves to the two waveguides 612, 613 corresponding to two sets of processing containers 100 and slot antennas 200a, respectively.

The slot antenna 200a has one waveguide connected to the waveguide 612 or the waveguide 613 therein. The slot antenna 200a transmits the microwaves distributed to two respective waveguides 612, 613 by the distributor 500 to the dielectric window 300 through the inner waveguide and radiates the transmitted microwaves to the processing space S of the processing container 100a combined with the slot antenna 200a.

The control unit 708 acquires, from the monitor unit 704, the monitor value of the voltage of each of the two waveguides 612, 613 which is monitored by the monitor unit 704. Then, the control unit 708 calculates a monitor difference which is a difference between the monitor value and the reference value of the voltage of each of the two waveguides 612, 613. In addition, the control unit 708 acquires, from the storage unit 702, a control value of a distribution ratio of the distributor 500 corresponding to the calculated monitor difference and controls the distribution ratio of the distributor 500 based on the acquired control value.

For example, it is assumed that the storage unit 702 stores a monitor difference "D1" and a control value "1:1" to correspond to each other. In this case, the control unit 708 acquires, from the storage unit 702, the control value "1:1" of the distribution ratio of the distributor 500 corresponding to the monitor difference, and outputs the acquired control value to the distributor 500. As a result, the distributor 500 distributes the microwaves input from the waveguide 602 to the two waveguides 612, 613, using the acquired control value "1:1". 50% of the microwaves distributed to the waveguide 612 are radiated to the processing space S in the processing container 100a from the slot antenna 200a corresponding to one set of the two sets of processing containers 100a and slot antennas 200a. The 50% of microwaves distributed to the waveguide 613 are radiated to the processing space S in the processing container 100a from the slot antenna 200a corresponding to the other set of the two sets of processing containers 100a and slot antennas 200a.

The microwave plasma processing apparatus 10a of Modified Example 1 may individually radiate the microwaves from each slot antenna to the processing space S of each processing container while distributing the microwaves to the two waveguides which correspond to the two sets of processing containers and slot antennas, respectively, at an optimal distribution ratio. As a result, the microwave plasma processing apparatus 10a may maintain plasma excited by the microwave in a uniform state in the processing space S of the processing container. Further, since the microwave plasma processing apparatus 10a may supply microwaves generated by one microwave generator to the plurality of processing containers simultaneously, the increase of the scale of the apparatus may be suppressed.

Modified Example 2

Figure 17:
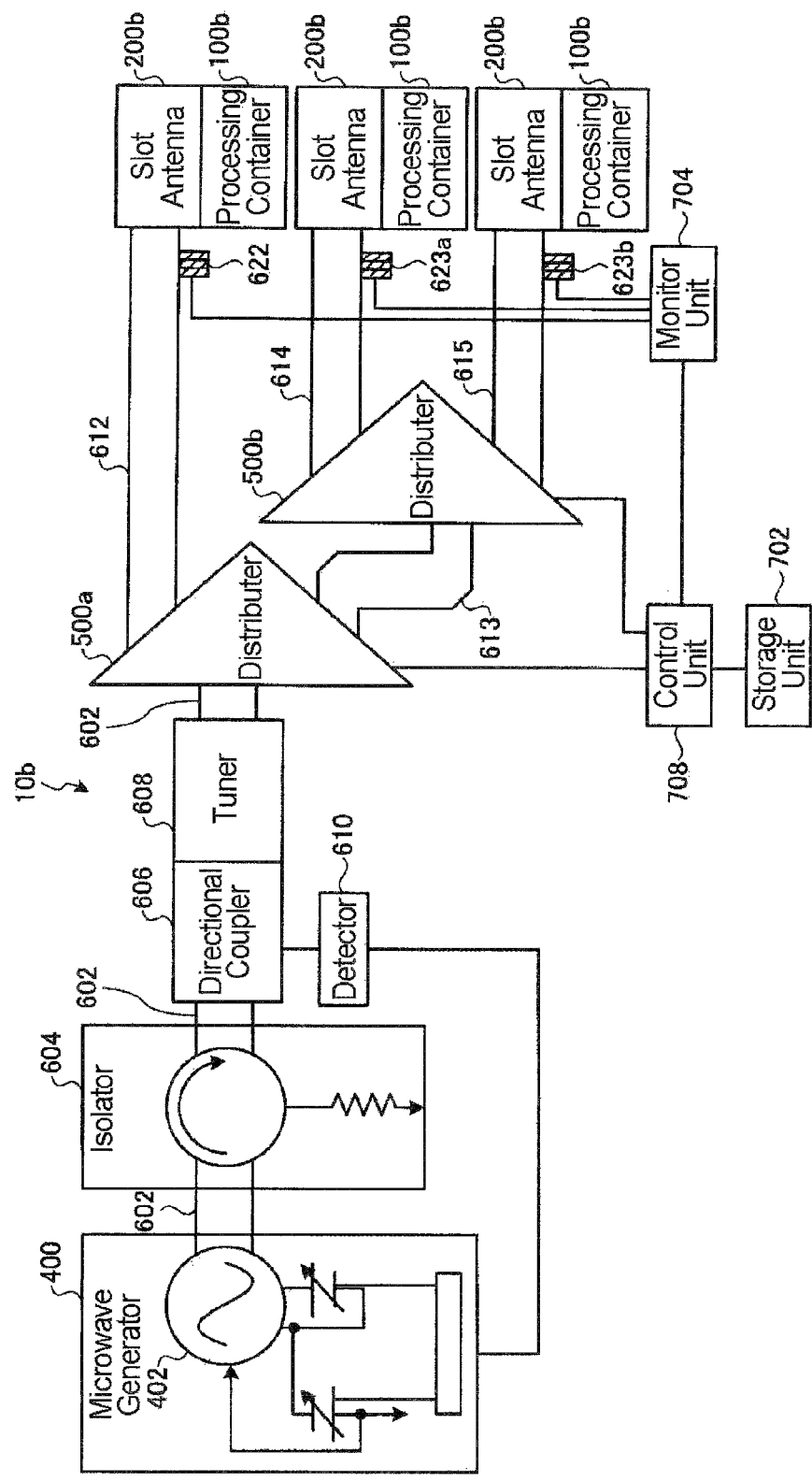
FIG. 17 is a diagram illustrating one example of an external configuration of Modified Example 2 of the microwave plasma processing apparatus according to the first exemplary embodiment.

Subsequently, Modified Example 2 of the microwave plasma processing apparatus according to the first exemplary embodiment will be described. FIG. 17 is a diagram illustrating an example of an external configuration of Modified Example 2 of the microwave plasma processing apparatus according to the first exemplary embodiment. The microwave plasma processing apparatus 10b according to Modified Example 2 is different from the microwave plasma processing apparatus 10 illustrated in FIG. 1 in that a plurality of sets of processing containers and slot antennas are provided and a plurality of distributors are provided. Therefore, in FIG. 17, descriptions on the same configuration as the microwave plasma processing apparatus 10 illustrated in FIG. 1 will be omitted.

As illustrated in FIG. 17, the microwave plasma processing apparatus 10b according to Modified Example 2 includes a plurality of sets of processing containers 100b and slot antennas 200b instead of the processing container 100 and the slot antenna 200 illustrated in FIG. 1. In Modified Example 2, the microwave plasma processing apparatus 10b includes three sets of processing containers 100b and slot antennas 200b.

The microwave plasma processing apparatus 10b of Modified Example 2 includes a plurality of distributors. In Modified Example 2, the microwave plasma processing apparatus 10b includes two distributors 500a and 500b. The two distributors 500a and 500b distribute microwaves input from the waveguide 602 to a plurality of waveguides stepwise sequentially. That is, the distributor 500a distributes the microwaves input from the waveguide 602 to the two waveguides 612, 613. One side microwaves distributed to the waveguide 612 by the distributor 500a are supplied to any one set of three sets of processing containers 100b and slot antennas 200b. The other side microwaves distributed to the waveguide 613 by the distributor 500a are supplied to the distributor 500b. The distributor 500b distributes the microwaves input from the distributor 500a through the waveguide 613 to the two waveguides 614, 615. One side microwaves distributed to the waveguide 614 by the distributor 500b are supplied to any one set of three sets of processing containers 100b and slot antennas 200b. The other side microwaves distributed to the waveguide 615 by the distributor 500b are supplied to any one set of the three sets of processing containers 100b and slot antennas 200b.

The slot antenna 200b has one waveguide connected to the waveguide 612, the waveguide 614, or the waveguide 615 therein. The slot antenna 200b transmits the microwaves distributed to the waveguide 612, the waveguide 614, or the waveguide 615 to the dielectric window 300 through the internal waveguide and radiates the transmitted microwaves to the processing space S of the processing container 100b combined with the slot antenna 200b.

For each distributor, the storage unit 702 stores a monitor difference which is a difference between a monitor value of the voltage of each of two waveguides which are microwave distribution targets and a predetermined voltage reference value, and a control value of the distribution ratio of the distributor corresponding to the monitor difference such that the monitor difference and the control value correspond to each other. For example, the storage unit 702 stores a monitor difference "D1" and a control value "1:2 (=waveguide 612:waveguide 613)" to correspond to each other, for the distributor 500a. Further, for example, the storage unit 702 stores a monitor difference "D1" and a control value "1:1 (=waveguide 614:waveguide 615)" to correspond to each other, for the distributor 500b.

The monitor unit 704 monitors the voltage of each of the waveguides 612, 614, 615 by using voltage sensors 622, 623a, 623b, which are installed in the waveguides 612, 614, 615, respectively, and output the monitor values to the control unit 708.

The control unit 708 individually controls a distribution ratio of each of a plurality of distributors based on the control values acquired from the storage unit 702. In detail, the control unit 708 acquires, from the monitor unit 704, a monitor value of the voltage of each of the waveguides 612, 614, 615 which is monitored by the monitor unit 704. In addition, the control unit 708 calculates a monitor difference which is a difference between the monitor value and the reference value of the voltage of each of the waveguides 612, 614, 615. In addition, the control unit 708 acquires, from the storage unit 702, the control value of the distribution ratio of the distributor corresponding to the calculated monitor difference and individually controls the distribution ratio of each of the plurality of distributors based on the acquired control value.

For example, it is assumed that the storage unit 702 stores a monitor difference "D1" and a control value "1:2 (=waveguide 612:waveguide 613)" to correspond to each other, for the distributor 500a, and stores a monitor difference "D1" and a control value "1:1 (=waveguide 614:waveguide 615)" to correspond to each other, for the distributor 500b. In this case, the control unit 708 acquires, from the storage unit 702, the control value "1:2 (=waveguide 612:waveguide 613)" of the distribution ratio of the distributor 500a corresponding to the monitor difference and outputs the acquired control value to the distributor 500a. Further, the control unit 708 acquires, from the storage unit 702, the control value "1:1 (=waveguide 614:waveguide 615)" of the distribution ratio of the distributor 500b corresponding to the monitor difference and outputs the acquired control value to the distributor 500b. As a result, the distributor 500a distributes the microwaves input from the waveguide 602 to the two waveguides 612, 613, using the acquired control value "1:2 (=waveguide 612:waveguide 613)". 33.3% of the microwaves distributed to the waveguide 612 are radiated to the processing space S in the processing container 100b from the slot antenna 200b corresponding to one set of the three sets of processing containers 100b and slot antennas 200b. 66.6% of the microwaves distributed to the waveguide 613 are supplied to the distributor 500b. The distributor 500b distributes the microwaves input from the distributor 500a through the waveguide 613 to the two waveguides 614, 615, using the acquired control value "1:1 (=waveguide 614: waveguide 615)". 50% of the microwaves distributed to the waveguide 614 are radiated to the processing space S in the processing container 100b from the slot antenna 200b corresponding to one set of the three sets of processing containers 100b and slot antennas 200b. 50% of the microwaves distributed to the waveguide 615 are radiated to the processing space S in the processing container 100b from the slot antenna 200b corresponding to the one set of the three sets of processing containers 100b and slot antennas 200b.

The microwave plasma processing apparatus 10b of Modified Example 2 may individually radiate microwaves to the processing space S of each processing container from each slot antenna while distributing the microwaves to three waveguides, which correspond to three sets of processing containers and the slot antennas, respectively, at an optimal distribution ratio. As a result, the microwave plasma processing apparatus 10b may maintain plasma excited by the microwave in a uniform state in the processing space S in the processing container. Further, since the microwave plasma processing apparatus 10b may supply microwaves generated by one microwave generator to the plurality of processing containers simultaneously, the increase of the size of the apparatus may be suppressed.

Modified Example 3

Figure 18:
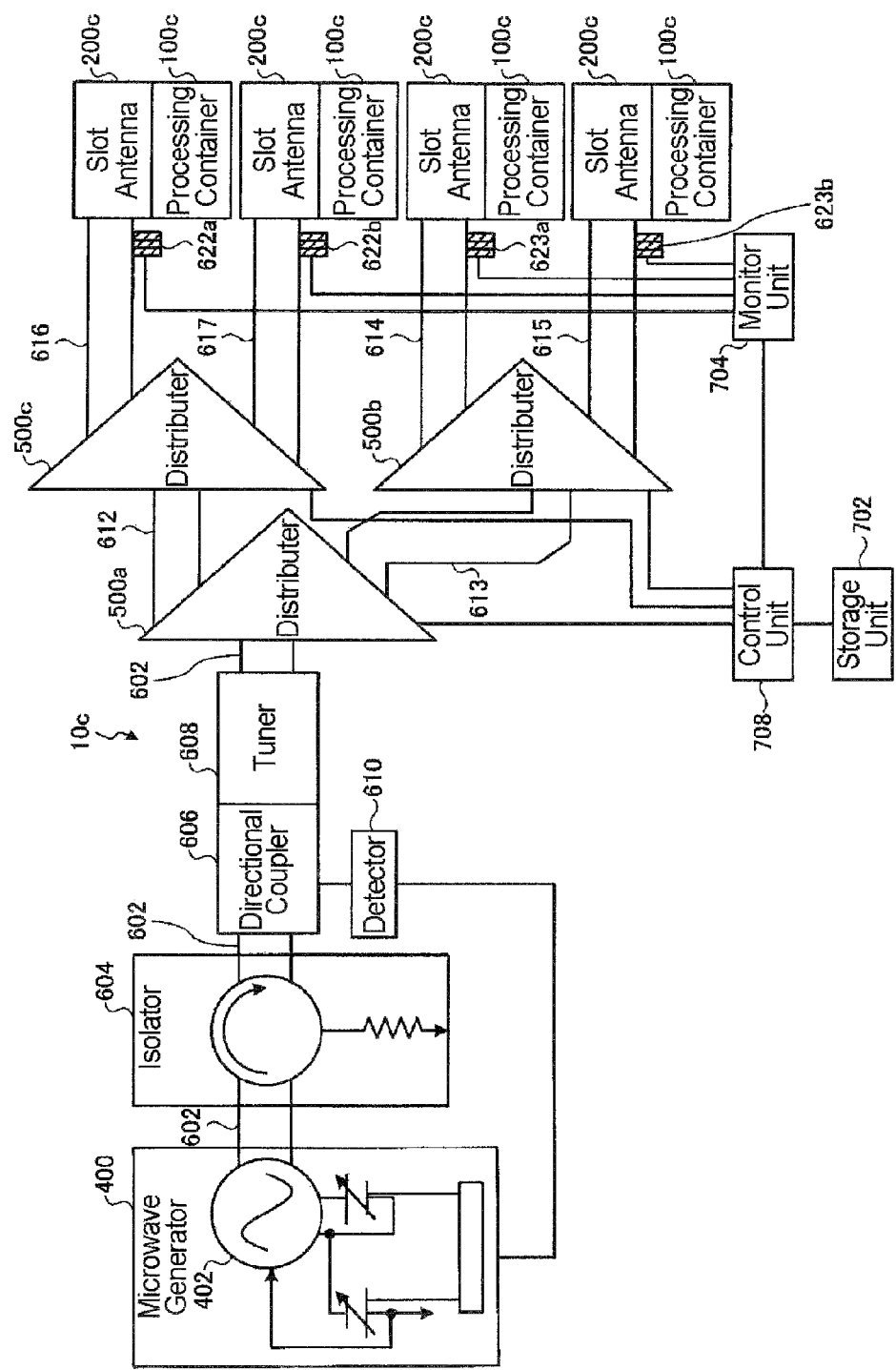
FIG. 18 is a diagram illustrating an example of an external configuration of Modified Example 3 of the microwave plasma processing apparatus according to the first exemplary embodiment.

Subsequently, Modified Example 3 of the microwave plasma processing apparatus according to the first exemplary embodiment will be described. FIG. 18 is a diagram illustrating an example of an external configuration of Modified Example 3 of the microwave plasma processing apparatus according to the first exemplary embodiment. The microwave plasma processing apparatus 10c according to Modified Example 3 is different from the microwave plasma processing apparatus 10 illustrated in FIG. 1 in that a plurality of sets of processing containers and slot antennas are provided and a plurality of distributors are provided. Therefore, in FIG. 18, descriptions on the same configuration as the microwave plasma processing apparatus 10 illustrated in FIG. 1 will be omitted.

As illustrated in FIG. 18, the microwave plasma processing apparatus 10c according to Modified Example 3 includes a plurality of sets of processing containers 100c and slot antennas 200c instead of the processing container 100 and the slot antenna 200 illustrated in FIG. 1. In Modified Example 3, the microwave plasma processing apparatus 10c includes four sets of processing containers 100c and slot antennas 200c.

The microwave plasma processing apparatus 10c of Modified Example 3 includes a plurality of distributors. In Modified Example 3, the microwave plasma processing apparatus 10c includes three distributors 500a, 500b, and 500c. The three distributors 500a, 500b, and 500c distribute microwaves input from the waveguide 602 to a plurality of waveguides stepwise sequentially. That is, the distributor 500a distributes the microwaves input from the waveguide 602 to two waveguides 612, 613. One side microwaves distributed to the waveguide 612 by the distributor 500a are supplied to the distributor 500c. The other side microwaves distributed to the waveguide 613 by the distributor 500a are supplied to the distributor 500b. The distributor 500b distributes the microwaves input from the distributor 500a through the waveguide 613 to two waveguides 614, 615. One side microwaves distributed to the waveguide 614 by the distributor 500b are supplied to any one set of the four sets of processing containers 100c and slot antennas 200c. The other side microwaves distributed to the waveguide 615 by the distributor 500b are supplied to any one set of the four sets of processing containers 100c and slot antennas 200c. The distributor 500c distributes the microwaves input from the distributor 500a through the waveguide 612 to two waveguides 616, 617. One side microwaves distributed to the waveguide 616 by the distributor 500c are supplied to any one set of the four sets of processing containers 100c and slot antennas 200c. The other side microwaves distributed to the waveguide 617 by the distributor 500c are supplied to any one set of the four sets of processing containers 100c and slot antennas 200c.

The slot antenna 200c has one waveguide connected to the waveguide 614, the waveguide 615, the waveguide 616, or the waveguide 617 therein. The slot antenna 200c transmits the microwaves distributed to the waveguide 614, the waveguide 615, the waveguide 616, or the waveguide 617 to the dielectric window 300 through the internal waveguide and radiates the transmitted microwaves to the processing space S of the processing container 100c combined with the slot antenna 200c.

For each distributor, the storage unit 702 stores a monitor difference which is a difference between a monitor value of the voltage of each of two waveguides which are microwave distribution targets and a predetermined voltage reference value, and a control value of the distribution ratio of the distributor corresponding to the monitor value such that the monitor difference and the control value correspond to each other. For example, the storage unit 702 stores a monitor difference "D1" and a control value "1:1 (=waveguide 612:waveguide 613)" to correspond to each other, for the distributor 500a. Further, for example, the storage unit 702 stores the monitor difference "D1" and a control value "1:1 (=waveguide 614:waveguide 615)" to correspond to each other, for the distributor 500b. Further, for example, the storage unit 702 stores a monitor difference "D1" and a control value "1:1 (=waveguide 616:waveguide 617)" to correspond to each other, for the distributor 500c.

The monitor unit 704 monitors a voltage of each of the waveguides 614, 615, 616, 617, using voltage sensors 623a, 623b, 622a, 622b which are installed in the waveguides 614, 615, 616, 617, respectively, and outputs the monitor value to the control unit 708.

The control unit 708 individually controls the distribution ratio of each of the plurality of distributors based on the control values acquired from the storage unit 702. Specifically, the control unit 708 acquires, from the monitor unit 704, a monitor value of the voltage of each of the waveguides 614, 615, 616, 617 which is monitored by the monitor unit 704. In addition, the control unit 708 calculates a monitor difference which is a difference between the monitor value and the reference value of the voltage of each of the waveguides 614, 615, 616, 617. In addition, the control unit 708 acquires, from the storage unit 702, the control value of the distribution ratio of the distributor corresponding to the calculated monitor difference and individually controls the distribution ratio of each of the plurality of distributors based on the acquired control value.

For example, it is assumed that the storage unit 702 stores a monitor difference "D1" and a control value "1:1 (=waveguide 612:waveguide 613)" to correspond to each other, for the distributor 500a, stores a monitor difference "D1" and the control value "1:1 (=waveguide 614:waveguide 615)" to correspond to each other, for respect to the distributor 500b, and stores a monitor difference "D2" and a control value "1:1 (=waveguide 616:waveguide 617)" to correspond to each other, for the distributor 500c. In this case, the control unit 708 acquires, from the storage unit 702, the control value "1:1 (=waveguide 612:waveguide 613)" of the distribution ratio of the distributor 500a corresponding to the monitor difference and outputs the acquired control value to the distributor 500a. Further, the control unit 708 acquires, from the storage unit 702, the control value "1:1 (=waveguide 614:waveguide 615)" of the distribution ratio of the distributor 500b corresponding to the monitor difference and outputs the acquired control value to the distributor 500b. Further, the control unit 708 acquires, from the storage unit 702, the control value "1:1 (=waveguide 616:waveguide 617)" of the distribution ratio of the distributor 500c corresponding to the monitor difference and outputs the acquired control value to the distributor 500c. As a result, the distributor 500a distributes the microwaves input from the waveguide 602 to the two waveguides 612, 613, using the acquired control value "1:1 (=waveguide 612:waveguide 613)". 50% of the microwaves distributed to the waveguide 612 are supplied to the distributor 500c. 50% of the microwaves distributed to the waveguide 613 are supplied to the distributor 500b. The distributor 500b distributes the microwaves input from the distributor 500a through the waveguide 613 to the two waveguides 614, 615, using the acquired control value "1:1 (=waveguide 614:waveguide 615)". 50% of the microwaves distributed to the waveguide 614 are radiated to the processing space S in the processing container 100c from the slot antenna 200c corresponding to one set of the four sets of processing containers 100c and slot antennas 200c. 50% of the microwaves distributed to the waveguide 615 are radiated to the processing space S in the processing container 100c from the slot antenna 200c corresponding to one set of the four sets of processing containers 100c and slot antennas 200c. The distributor 500c distributes microwaves input from the distributor 500a through the waveguide 616 to the two waveguides 616, 617, using the acquired control value "1:1 (=waveguide 616: waveguide 617)". 50% of the microwaves distributed to the waveguide 616 are radiated to the processing space S in the processing container 100c from the slot antenna 200c corresponding to one set of the four sets of processing containers 100c and slot antennas 200c. 50% of the microwaves distributed to the waveguide 617 are radiated to the processing space S in the processing container 100c from the slot antenna 200c corresponding to one set of four sets of processing containers 100c and slot antennas 200c.

The microwave plasma processing apparatus 10c of Modified Example 3 may individually radiate microwaves to the processing space S of each processing container from each slot antenna while distributing the microwaves to four waveguides which correspond to four sets of the processing containers and the slot antennas, respectively, at an optimal distribution ratio. As a result, the microwave plasma processing apparatus 10c may maintain plasma excited by the microwaves in a uniform state in the processing space S in the processing container. Further, since the microwave plasma processing apparatus 10c may supply microwaves generated by one microwave generator to the plurality of processing containers simultaneously, the increase of the size of the apparatus may be suppressed.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A microwave plasma processing apparatus comprising:
a processing container configured to define a processing space;
a microwave generator configured to generate microwaves for generating plasma of a processing gas introduced into the processing space;
a distributor configured to distribute the microwaves to a plurality of waveguides;
an antenna installed in the processing container to seal the processing space, and to radiate the microwaves distributed to the plurality of waveguides by the distributor, to the processing space;
a monitor unit configured to monitor a voltage of each of the plurality of waveguides;
a storage unit configured to store a difference between a monitor value of the voltage monitored by the monitor unit and a predetermined reference value of the voltage and a control value of a distribution ratio of the distributor corresponding to the difference; and
a control unit configured to acquire the control value of the distribution ratio of the distributor, which corresponds to the difference between the monitor value of the voltage monitored by the monitor unit and the predetermined reference value of the voltage, from the storage unit when the monitor value of the voltage monitored by the monitor unit is changed and to control the distribution ratio of the distributor based on the acquired control value thereby distributing the microwaves to the plurality of waveguides of the antenna.

2. The microwave plasma processing apparatus of claim 1, further comprising:
a phase shifter installed in a specific waveguide of at least one of the plurality of waveguides to shift a phase of a voltage of the specific waveguide by a set shift amount,
wherein apart from the control of the distribution ratio of the distributor, the control unit properly controls the phase of the voltage of the specific waveguide and phases of voltages of waveguides other than the specific waveguide among the plurality of waveguides using the monitor value of the voltage monitored by the monitor unit so as to control the shift amount of the phase shifter such that the phases become inverse phases in a dielectric window below the antenna.

3. The microwave plasma processing apparatus of claim 1, further comprising:
a waveguide guiding the microwave generated by the microwave generator to the distributor; and
a tuner installed in the waveguide to match impedance at the microwave generator side and impedance of the antenna side.

4. The microwave plasma processing apparatus of claim 1, wherein the microwave plasma processing apparatus is provided with a plurality of sets of processing containers and antennas,
the distributor distributes microwaves to the plurality of waveguides corresponding to the plurality of sets of processing containers and the antennas, respectively,
the antenna radiates the microwaves distributed to each of the plurality of waveguides by the distributor to the processing space of the processing container combined with the antenna, and
the control unit controls the distribution ratio of the distributor based on the control value acquired from the storage unit.

5. The microwave plasma processing apparatus of claim 1, wherein the microwave plasma processing apparatus is provided with a plurality of distributors,
the plurality of distributors distribute the microwaves generated by the microwave generator to the plurality of waveguides stepwise sequentially,
the storage unit stores the difference and a control value of the distribution ratio of the distributor corresponding to the difference to correspond to each other, for each distributor, and
the control unit individually controls the distribution ratio of each of the plurality of distributors based on the control value acquired from the storage unit.

6. A microwave supplying method using a microwave plasma processing apparatus including a processing container configured to defined a processing space, a microwave generator configured to generate microwaves for generating plasma of a processing gas introduced into the processing space, a distributor configured to distribute the microwaves to a plurality of waveguides, an antenna installed in the processing container so as to seal the processing space and to radiating, to the processing space, the microwaves distributed to the plurality of waveguides by the distributor, the method comprising:

monitoring a voltage of each of the plurality of waveguides;

storing a difference between a monitor value of the voltage monitored by a monitor unit and a predetermined reference value of the voltage and a control value of a distribution ratio of the distributor corresponding to the difference;

acquiring the control value of the distribution ratio of the distributor corresponding to the difference between the monitor value of the monitored voltage and the predetermined reference value of the voltage from the storage unit when the monitor value of the voltage monitored by the monitor unit is changed; and controlling the distribution ratio of the distributor based on the control value acquired at the acquiring in order to distribute the microwaves to the plurality of waveguides of the antenna.

* * * * *